United States Patent
Yamane et al.

(10) Patent No.: US 10,128,435 B2
(45) Date of Patent: *Nov. 13, 2018

(54) MEMORY ELEMENT AND MEMORY DEVICE

(71) Applicant: Sony Corporation, Tokyo (JP)

(72) Inventors: Kazutaka Yamane, Kanagawa (JP); Masanori Hosomi, Tokyo (JP); Hiroyuki Ohmori, Tokyo (JP); Kazuhiro Bessho, Kanagawa (JP); Yutaka Higo, Kanagawa (JP); Hiroyuki Uchida, Kanagawa (JP); Tetsuya Asayama, Tokyo (JP)

(73) Assignee: Sony Corporation, Tokyo (JP)

( * ) Notice: Subject to any disclaimer, the term of this patent is extended or adjusted under 35 U.S.C. 154(b) by 81 days.

This patent is subject to a terminal disclaimer.

(21) Appl. No.: 15/047,311

(22) Filed: Feb. 18, 2016

(65) Prior Publication Data

US 2016/0163969 A1 Jun. 9, 2016

Related U.S. Application Data

(63) Continuation of application No. 14/446,685, filed on Jul. 30, 2014, now Pat. No. 9,293,693, which is a
(Continued)

(30) Foreign Application Priority Data

Sep. 6, 2010 (JP) ................................ 2010-198936
Jan. 18, 2011 (JP) ................................ 2011-007665

(51) Int. Cl.
*H01L 43/10* (2006.01)
*H01L 43/02* (2006.01)
(Continued)

(52) U.S. Cl.
CPC .............. *H01L 43/10* (2013.01); *G11C 11/16* (2013.01); *G11C 11/161* (2013.01); *H01L 43/02* (2013.01); *H01L 43/08* (2013.01)

(58) Field of Classification Search
CPC ................... H01L 27/222; H01L 43/08; G11C 11/16–11/161
See application file for complete search history.

(56) References Cited

U.S. PATENT DOCUMENTS 6,256,223 B1 7/2001 Sun
6,313,973 B1 * 11/2001 Fuke ..................... B82Y 10/00
360/324.1
(Continued)

FOREIGN PATENT DOCUMENTS

CN 101266831 9/2008
JP 2003-17782 1/2003
(Continued)

OTHER PUBLICATIONS

L. Berger, "Emission of spin waves by a magnetic multilayer traversed by a current", Physical Review B, vol. 54, No. 13, 1996.
(Continued)

*Primary Examiner* — Khaja Ahmad
(74) *Attorney, Agent, or Firm* — K&L Gates LLP

(57) ABSTRACT

There is disclosed an information storage element including a first layer including a ferromagnetic layer with a magnetization direction perpendicular to a film face; an insulation layer coupled to the first layer; and a second layer coupled to the insulation layer opposite the first layer, the second layer including a fixed magnetization so as to be capable of serving as a reference of the first layer. The first layer is capable of storing information according to a magnetization state of a magnetic material, and the magnetization state is configured to be changed by a spin injection. A magnitude of an effective diamagnetic field which the first layer
(Continued)

receives is smaller than a saturated magnetization amount of the first layer.

19 Claims, 12 Drawing Sheets

Related U.S. Application Data continuation of application No. 13/215,405, filed on Aug. 23, 2011, now Pat. No. 8,829,631.

(51) Int. Cl.
*G11C 11/16* (2006.01)
*H01L 43/08* (2006.01)

(56) References Cited

U.S. PATENT DOCUMENTS

| | | | | |
|---|---|---|---|---|
| 6,831,314 B2 * | 12/2004 | Higo | B82Y 25/00 257/295 |
| 6,879,514 B2 * | 4/2005 | Hosomi | G11C 11/16 365/158 |
| 7,034,348 B2 * | 4/2006 | Ohba | B82Y 10/00 257/295 |
| 7,242,045 B2 * | 7/2007 | Nguyen | B82Y 25/00 257/204 |
| 7,583,529 B2 * | 9/2009 | Chen | G11C 11/16 365/171 |
| 7,633,796 B2 | 12/2009 | Yamane et al. | |
| 7,660,153 B2 | 2/2010 | Yamane | |
| 7,663,197 B2 * | 2/2010 | Nagase | B82Y 25/00 257/421 |
| 7,936,598 B2 | 5/2011 | Zheng et al. | |
| 8,036,025 B2 | 10/2011 | Nagase et al. | |
| 8,040,724 B2 | 10/2011 | Suzuki et al. | |
| 8,208,219 B2 * | 6/2012 | Zhang | G11B 5/1278 360/125.03 |
| 8,339,840 B2 | 12/2012 | Hosomi et al. | |
| 8,363,462 B2 | 1/2013 | Nagase et al. | |
| 8,416,620 B2 | 4/2013 | Zheng et al. | |
| 8,436,438 B2 | 5/2013 | Bessho et al. | |
| 8,445,980 B2 | 5/2013 | Higo et al. | |
| 8,455,967 B2 | 6/2013 | Higo et al. | |
| 2004/0245553 A1 * | 12/2004 | Hosomi | B82Y 10/00 257/295 |
| 2005/0057992 A1 * | 3/2005 | Yagami | B82Y 25/00 365/222 |
| 2005/0073883 A1 * | 4/2005 | Anthony | G11C 11/16 365/173 |
| 2005/0184839 A1 | 8/2005 | Nguyen et al. | |
| 2006/0060901 A1 * | 3/2006 | Nakamura | G11C 11/16 257/295 |
| 2007/0007610 A1 * | 1/2007 | Saito | G11C 11/16 257/422 |
| 2007/0030724 A1 * | 2/2007 | Hosomi | G11C 11/16 365/158 |
| 2007/0242502 A1 * | 10/2007 | Hosomi | B82Y 25/00 365/158 |
| 2008/0112215 A1 * | 5/2008 | Ikarashi | G11C 11/16 365/158 |
| 2008/0140922 A1 * | 6/2008 | Higo | B82Y 25/00 711/105 |
| 2008/0151607 A1 * | 6/2008 | Hosomi | G11C 11/16 365/158 |
| 2008/0164547 A1 * | 7/2008 | Higo | B82Y 10/00 257/421 |
| 2008/0180992 A1 * | 7/2008 | Yamane | G11C 11/16 365/171 |
| 2008/0225581 A1 * | 9/2008 | Yamane | G11C 11/16 365/171 |
| 2008/0253039 A1 * | 10/2008 | Nagamine | B82Y 10/00 360/324.2 |
| 2009/0080239 A1 | 3/2009 | Nagase | |
| 2009/0091863 A1 * | 4/2009 | Hosotani | B82Y 25/00 360/324.2 |
| 2009/0213642 A1 * | 8/2009 | Raberg | G11C 11/16 365/158 |
| 2009/0246557 A1 * | 10/2009 | Horng | G01R 33/098 428/811.1 |
| 2009/0285017 A1 | 11/2009 | Yamane et al. | |
| 2010/0020592 A1 * | 1/2010 | Hosotani | G11C 11/16 365/158 |
| 2010/0028530 A1 * | 2/2010 | Parkin | B82Y 10/00 427/130 |
| 2010/0080050 A1 * | 4/2010 | Ozeki | B82Y 25/00 365/158 |
| 2010/0118600 A1 | 5/2010 | Nagase et al. | |
| 2010/0188890 A1 * | 7/2010 | Fukami | B82Y 10/00 365/158 |
| 2010/0193890 A1 * | 8/2010 | Suzuki | B82Y 10/00 257/421 |
| 2010/0200939 A1 * | 8/2010 | Hosomi | B82Y 10/00 257/421 |
| 2010/0230770 A1 * | 9/2010 | Yoshikawa | G11C 11/16 257/421 |
| 2010/0271870 A1 * | 10/2010 | Zheng | B82Y 25/00 365/171 |
| 2010/0276771 A1 * | 11/2010 | Fukumoto | B82Y 25/00 257/421 |
| 2010/0314673 A1 * | 12/2010 | Yamane | B82Y 25/00 257/295 |
| 2010/0328992 A1 * | 12/2010 | Kano | G11C 11/005 365/158 |
| 2010/0328993 A1 * | 12/2010 | Ohmori | G11C 11/16 365/158 |
| 2010/0328998 A1 * | 12/2010 | Higo | G11C 11/16 365/171 |
| 2010/0328999 A1 * | 12/2010 | Higo | G11C 11/16 365/171 |
| 2011/0026322 A1 * | 2/2011 | Ohmori | G11C 11/16 365/171 |
| 2011/0058412 A1 | 3/2011 | Zheng et al. | |
| 2011/0059557 A1 * | 3/2011 | Yamagishi | H01L 27/228 438/3 |
| 2011/0063899 A1 * | 3/2011 | Ogimoto | G11C 11/16 365/158 |
| 2011/0073970 A1 * | 3/2011 | Kai | G11C 11/16 257/421 |
| 2011/0103143 A1 * | 5/2011 | Ranjan | G11C 11/14 365/171 |
| 2011/0169111 A1 * | 7/2011 | Hu | B82Y 25/00 257/421 |
| 2011/0188157 A1 * | 8/2011 | Zhao | G11B 5/3906 360/313 |
| 2011/0188298 A1 * | 8/2011 | Suzuki | G11C 11/16 365/158 |
| 2011/0211389 A1 | 9/2011 | Yoshikawa et al. | |
| 2011/0222335 A1 | 9/2011 | Yoshikawa et al. | |
| 2011/0233700 A1 * | 9/2011 | Hayakawa | B82Y 25/00 257/421 |
| 2011/0254114 A1 | 10/2011 | Nagamine et al. | |
| 2011/0305077 A1 * | 12/2011 | Higo | G11C 11/16 365/171 |
| 2011/0310660 A1 * | 12/2011 | Yamada | B82Y 25/00 365/158 |
| 2011/0316102 A1 * | 12/2011 | Ohmori | H01L 43/08 257/421 |
| 2011/0316103 A1 * | 12/2011 | Uchida | B82Y 25/00 257/421 |
| 2011/0316104 A1 * | 12/2011 | Inokuchi | B82Y 25/00 257/421 |
| 2012/0001281 A1 * | 1/2012 | Yamane | H01L 43/08 257/421 |
| 2012/0002466 A1 * | 1/2012 | Higo | G11C 11/16 365/171 |
| 2012/0008381 A1 | 1/2012 | Nagase et al. | |
| 2012/0012954 A1 * | 1/2012 | Yamada | B82Y 25/00 257/421 |

(56) References Cited

U.S. PATENT DOCUMENTS

| | | | | |
|---|---|---|---|---|
| 2012/0019283 A1* | 1/2012 | Saito | G11C 11/16 | 326/38 |
| 2012/0032289 A1* | 2/2012 | Ohmori | H01L 27/228 | 257/427 |
| 2012/0043631 A1* | 2/2012 | Ohmori | H01L 43/08 | 257/421 |
| 2012/0056284 A1* | 3/2012 | Higo | G11C 11/16 | 257/421 |
| 2012/0056285 A1* | 3/2012 | Bessho | G11C 11/16 | 257/421 |
| 2012/0056286 A1* | 3/2012 | Higo | G11C 11/16 | 257/421 |
| 2012/0057403 A1* | 3/2012 | Bessho | B82Y 25/00 | 365/171 |
| 2012/0061779 A1* | 3/2012 | Ohmori | H01L 43/10 | 257/421 |
| 2012/0061780 A1* | 3/2012 | Uchida | G11C 11/16 | 257/421 |
| 2012/0061781 A1* | 3/2012 | Ohmori | G11C 11/14 | 257/421 |
| 2012/0063217 A1* | 3/2012 | Hosomi | G11C 11/16 | 365/158 |
| 2012/0063220 A1* | 3/2012 | Higo | G11C 11/16 | 365/173 |
| 2012/0063221 A1* | 3/2012 | Yamane | B82Y 25/00 | 365/173 |
| 2012/0063222 A1* | 3/2012 | Yamane | G11C 11/16 | 365/173 |
| 2012/0107964 A1* | 5/2012 | Ranjan | G11C 11/15 | 438/3 |
| 2012/0115253 A1* | 5/2012 | Kaneko | H01L 23/5227 | 438/3 |
| 2012/0155158 A1* | 6/2012 | Higo | G11C 11/1677 | 365/158 |
| 2012/0163070 A1* | 6/2012 | Nagase | B82Y 25/00 | 365/158 |
| 2012/0170361 A1 | 7/2012 | Ranjan et al. | | |
| 2012/0175716 A1* | 7/2012 | Bessho | G11C 11/161 | 257/421 |
| 2012/0175717 A1* | 7/2012 | Bessho | G11C 11/16 | 257/421 |
| 2012/0182796 A1* | 7/2012 | Uchida | G11C 11/161 | 365/171 |
| 2012/0199922 A1* | 8/2012 | Uchida | G11C 11/16 | 257/421 |
| 2012/0225322 A1* | 9/2012 | Han | B82Y 10/00 | 428/815 |
| 2012/0230089 A1* | 9/2012 | Yamada | G11C 11/16 | 365/158 |
| 2012/0273856 A1* | 11/2012 | Ishikawa | B82Y 10/00 | 257/295 |
| 2012/0287696 A1* | 11/2012 | Ohmori | H01L 27/226 | 365/66 |
| 2012/0300540 A1* | 11/2012 | Liu | G11C 11/16 | 365/158 |
| 2012/0300541 A1* | 11/2012 | Higo | G11C 11/16 | 365/171 |
| 2012/0300542 A1* | 11/2012 | Uchida | G11C 11/161 | 365/171 |
| 2013/0001714 A1* | 1/2013 | Nishiyama | G11C 11/16 | 257/421 |
| 2013/0028013 A1* | 1/2013 | Ikeda | B82Y 25/00 | 365/158 |
| 2013/0033931 A1* | 2/2013 | Yamane | G11C 11/161 | 365/171 |
| 2013/0288398 A1* | 10/2013 | Yamamoto | H01L 43/08 | 438/3 |
| 2014/0042573 A1 | 2/2014 | Yamamoto et al. | | |
| 2014/0299951 A1* | 10/2014 | Guo | H01L 43/12 | 257/421 |

FOREIGN PATENT DOCUMENTS

| | | |
|---|---|---|
| JP | 2006-165264 | 6/2006 |
| JP | 2006-196612 | 7/2006 |
| JP | 2008-227388 | 9/2008 |
| JP | 2008-0252037 | 10/2008 |
| JP | 2009-081315 | 4/2009 |
| JP | 2010-016408 | 1/2010 |

OTHER PUBLICATIONS

J.C. Slonczewski, "Current-driven excitation of magnetic multilayers", Journal of Magnetism and Magnetic Material, 159, L1-L7, 1996.

Albert, et al., "Spin-polarized current switching of a Co thin film nanomagnet", Applied Physics Letters, vol. 77, No. 23, 2000.

Mangin, et al., "Current-induced magnetization reversal in nanopillars with perpendicular anisotrophy", Nature Publishing Group, vol. 5, 2006.

Chinese Office Action dated Jun. 9, 2015 in corresponding Chinese Application No. 201110253669.8.

Japanese Office Action dated Jan. 6, 2015 in corresponding Japanese Application No. 2011-007665.

Ikeda, et al., A perpendicular-anisotrophy CoFeB—MgO magnetic tunnel junction, Nature Materials Letters, Jul. 11, 2010.

* cited by examiner

MEMORY ELEMENT AND MEMORY DEVICE

CROSS REFERENCES TO RELATED APPLICATIONS

The present application is a continuation application of U.S. patent application Ser. No. 14/446,685, filed Jul. 30, 2014, which application is a continuation of U.S. patent application Ser. No. 13/215,405, filed Aug. 23, 2011, issued as U.S. Pat. No. 8,829,631 on Aug. 23, 2011, which application claims priority to Japanese Priority Patent Application JP 2010-198936 filed in the Japan Patent Office on Sep. 6, 2010 and Japanese Priority Patent Application JP 2011-007665 filed in the Japan Patent Office on Jan. 18, 2011, the entire contents of which are hereby incorporated by reference.

BACKGROUND

The present application relates to a memory element that includes a memory layer that stores the magnetization state of a ferromagnetic layer as information and a magnetization-fixed layer in which a magnetization direction is fixed, and that changes the magnetization direction of the memory layer by flowing a current, and a memory device having the memory element.

In an information device such as a computer, a highly dense DRAM that operates at a high speed has been widely used as a random access memory.

However, the DRAM is a volatile memory in which information is erased when power is turned off, such that a non-volatile memory in which the information is not erased is desirable.

In addition, as a candidate for the non-volatile memory, a magnetic random access memory (MRAM) in which the information is recorded by magnetization of a magnetic material has attracted attention and therefore has been developed.

The MRAM makes a current flow to two kinds of address interconnects (a word line and a bit line) that are substantially perpendicular to each other, respectively, and inverts the magnetization of a magnetic layer of a magnetic memory element, which is located at an intersection of the address interconnects, of the magnetic memory element by using a current magnetic field generated from each of the address interconnects, and thereby performs the recording of information.

A schematic diagram (perspective view) of a general MRAM is shown in FIG. 10.

A drain region 108, a source region 107, and a gate electrode 101, which make up a selection transistor that selects each memory cell, are formed at portions separated by an element separation layer 102 of a semiconductor substrate 110 such as a silicon substrate, respectively.

In addition, a word line 105 extending in the front-back direction in the drawing are provided at an upper side of the gate electrode 101.

The drain region 108 is formed commonly to left and right selection transistors in the drawing, and an interconnect 109 is connected to the drain region 108.

In addition, magnetic memory elements 103, each having a memory layer whose magnetization direction is inverted, are disposed between the word line 105 and bit lines 106 that are disposed at an upper side in relation to the word line 105 and extend in the left-right direction in the drawing. These magnetic memory elements 103 are configured, for example, by a magnetic tunnel junction element (MTJ element).

In addition, the magnetic memory elements 103 are electrically connected to the source region 107 through a horizontal bypass line 111 and a vertical contact layer 104.

When a current is made to flow to the word line 105 and the bit lines 106, a current magnetic field is applied to the magnetic memory element 103 and thereby the magnetization direction of the memory layer of the magnetic memory element 103 is inverted, and therefore it is possible to perform the recording of information.

In addition, in regard to a magnetic memory such as the MRAM, it is necessary for the magnetic layer (memory layer) in which the information is recorded to have a constant coercive force in order to stably retain the recorded information.

On the other hand, it is necessary to make a certain amount of current flow to the address interconnect in order to rewrite the recorded information.

However, along with miniaturization of the element making up the MRAM, the address interconnect becomes thin, such that it is difficult to flow a sufficient current.

Therefore, as a configuration capable of realizing the magnetization inversion with a relatively small current, a memory having a configuration using a magnetization inversion using spin injection has attracted attention (for example, refer to Japanese Unexamined Patent Application Publication Nos. 2003-17782 and 2008-227388, and a specification of U.S. Pat. No. 6,256,223, Phys. Rev. B, 54.9353 (1996), and J. Magn. Mat., 159, L1 (1996)).

Magnetization inversion using the spin injection means that a spin polarized electron after passing through a magnetic material is injected to the other magnetic material, and thereby magnetization inversion is caused in the other magnetic material.

For example, when a current is made to flow to a giant magnetoresistive effect element (GMR element) or a magnetic tunnel junction element (MTJ element) in a direction perpendicular to a film face, the magnetization direction of at least a part of the magnetic layer of this element may be inverted.

In addition, magnetization inversion using spin injection has an advantage in that even when the element becomes minute, it is possible realize the magnetization inversion without increasing the current.

A schematic diagram of the memory device having a configuration using the magnetization inversion using the above-described spin injection is shown in FIGS. 11 and 12. FIG. 11 shows a perspective view, and FIG. 12 shows a cross-sectional view.

A drain region 58, a source region 57, and a gate electrode 51 that make up a selection transistor for the selection of each memory cell are formed, respectively, in a semiconductor substrate 60 such as a silicon substrate at portions isolated by an element isolation layer 52. Among them, the gate electrode 51 also functions as a word line extending in the front-back direction in FIG. 11.

The drain region 58 is formed commonly to left and right selection transistors in FIG. 11, and an interconnect 59 is connected to the drain region 58.

A memory element 53 having a memory layer in which a magnetization direction is inverted by spin injection is disposed between the source region 57 and bit lines 56 that are disposed in an upper side of the source region 57 and extend in the left-right direction in FIG. 11.

This memory element 53 is configured by, for example, a magnetic tunnel junction element (MTJ element). The memory element 53 has two magnetic layers 61 and 62. In the two magnetic layers 61 and 62, one side magnetic layer is set as a magnetization-fixed layer in which the magnetization direction is fixed, and the other side magnetic layer is set as a magnetization-free layer in which the magnetization direction varies, that is, a memory layer.

In addition, the memory element 53 is connected to each bit line 56 and the source region 57 through the upper and lower contact layers 54, respectively. In this manner, when a current is made to flow to the memory element 53, the magnetization direction of the memory layer may be inverted by spin injection.

In the case of the memory device having a configuration using the magnetic inversion using this spin injection, it is possible to make the structure of the device simple compared to the general MRAM shown in FIG. 10, and therefore it has a characteristic in that high densification becomes possible.

In addition, when magnetization inversion using the spin injection is used, there is an advantage in that even as miniaturization of the element proceeds, a write current is not increased, compared to the general MRAM performing the magnetization inversion by an external magnetic field.

SUMMARY

However, in the case of the MRAM, a write interconnect (word line or bit line) is provided separately from the memory element, and the writing of information (recording) is performed using a current magnetic field generated by flowing a current to the write interconnect. Therefore, it is possible to make a sufficient amount of current necessary for the writing flow to the write interconnect.

On the other hand, in the memory device having a configuration using magnetization inversion using the spin injection, it is necessary to invert the magnetization direction of the memory layer by performing spin injection using a current flowing to the memory element.

Since the writing (recording) of information is performed by directly flowing a current to the memory element as described above, a memory cell is configured by connecting the memory element to a selection transistor to select a memory cell that performs the writing. In this case, the current flowing to the memory element is restricted to a current magnitude capable of flowing to the selection transistor (a saturation current of the selection transistor).

Therefore, it is necessary to perform writing with a current equal to or less than the saturation current of the selection transistor, and therefore it is necessary to diminish the current flowing to the memory element by improving spin injection efficiency.

In addition, to increase a read-out signal strength, it is necessary to secure a large magnetoresistance change ratio, and to realize this, it is effective to adopt a configuration of the memory element where an intermediate layer that comes into contact with both faces of the memory layer is set as a tunnel insulation layer (tunnel barrier layer).

In this way, in a case where the tunnel insulation layer is used as the intermediate layer, the amount of current flowing to the memory element is restricted to prevent the insulation breakdown of the tunnel insulation layer. From this viewpoint, it is also necessary to restrict the current at the time of spin injection.

Since such a current value is proportional to a film thickness of the memory layer and is proportional to the square of the saturation magnetization of the memory layer, it may be effective to adjust these (film thickness and saturated magnetization) to decrease such a current value (for example, refer to F. J. Albert et al., Appl. Phy. Lett., 77, 3809 (2000)).

For example, in U.S. Patent Application Publication No. 2005/0184839 A1, the fact that when the amount of magnetization (Ms) of the recording material is decreased, the current value may be diminished is disclosed.

However, on the other hand, if the information written by the current is not stored, non-volatile memory is not realized. That is, it is necessary to secure stability (thermal stability) against the thermal fluctuation of the memory layer.

In the case of the memory element using magnetization inversion using spin injection, since the volume of the memory layer becomes small, simply considered the thermal stability tends to decrease, compared to the MRAM in the related art.

When thermal stability of the memory layer is not secured, the inverted magnetization direction re-inverts by heating, and this leads to writing error.

In addition, in a case where a high capacity of the memory element using magnetization inversion using the spin injection is advanced, the volume of the memory element becomes smaller, such that securing the thermal stability becomes an important problem.

Therefore, in regard to the memory element using the magnetization inversion using spin injection, thermal stability is a very important characteristic.

Therefore, to realize a memory element having a configuration where the magnetization direction of the memory layer as a memory is inverted by spin injection, it is necessary to diminish the current necessary for the magnetization inversion using the spin injection to a value equal to or less than the saturation current of the transistor, and thereby securing the thermal stability for retaining the written information reliably.

As described above, to diminish the current necessary for the magnetization inversion using spin injection, diminishing a saturated magnetization amount Ms of the memory layer, or making the memory layer thin may be considered. For example, as is the case with U.S. Patent Application Publication No. 2005/0184839 A1, it is effective to use a material having a small saturated magnetization amount Ms as the material for the memory layer. However, in this way, in a case where the material having the small saturated magnetization amount Ms is simply used, it is difficult to secure thermal stability for reliably retaining information.

Therefore, in this disclosure, it is desirable to provide a memory element capable of improving thermal stability without increasing the write current, and a memory device having the memory element. In addition, it is desirable to provide a memory element that is excellent in a characteristic even when the magnetic material making up the memory layer is subjected to a heat treatment at temperatures of 350° C. or more.

According to an embodiment, there is provided a memory element including a memory layer that has a magnetization perpendicular to a film face and a magnetization direction thereof varies corresponding to information; a magnetization-fixed layer that has magnetization that is perpendicular to the film face and becomes a reference for the information stored in the memory layer; and an insulating layer that is provided between the memory layer and the magnetization-fixed layer and is formed of a non-magnetic material. An electron that is spin-polarized is injected in a lamination direction of a layered structure having the memory layer, the insulating layer, and the magnetization-fixed layer, and thereby the magnetization direction of the memory layer varies and a recording of information is performed with respect to the memory layer, and a magnitude of an effective diamagnetic field which the memory layer receives is smaller than a saturated magnetization amount of the memory layer.

In addition, a ferromagnetic material making up the memory layer may be Co—Fe—B.

In this case, a composition of the Co—Fe—B may be $(Co_x$—$Fe_y)_{100-z}$—$B_z$, in which $0 \leq Co_x \leq 40$, $60 \leq Fe_y \leq 100$, and $0 < B_z \leq 30$.

In addition, a composition of the Co—Fe—B may be $(Co_x$—$Fe_y)_{100-z}$—$B_z$, in which $0 \leq Co_x \leq 40$, $60 \leq Fe_y \leq 100$, and $20 < B_z \leq 40$.

According to another embodiment, there is provided a memory device including a memory element that retains information through the magnetization state of a magnetic material, and two kinds of interconnects that intersect each other, wherein the memory element has the configuration of the above-described memory element according to the embodiment, the memory element is disposed between the two kinds of interconnects, and a current flows to the memory element in the lamination direction through the two kinds of interconnects, and thereby a spin-polarized electron is injected to the memory element.

According to the configuration of the memory element of the embodiment, a memory layer that retains information through a magnetization state of a magnetic material is provided, a magnetization-fixed layer is provided over the memory layer through an intermediate layer, the intermediate layer is formed of an insulating material, an electron that is spin-polarized is injected in a lamination direction and the magnetization direction of the memory layer is changed and thereby a recording of information is performed with respect to the memory layer, and therefore it is possible to perform the recording of the information by flowing a current in the lamination direction and by injecting a spin-polarized electron.

In addition, the magnitude of an effective diamagnetic field which the memory layer receives is smaller than a saturated magnetization amount of the memory layer, the diamagnetic field which the memory layer receives decreases, and therefore it is possible to diminish an amount of a write current necessary for inverting the magnetization direction of the memory layer.

On the other hand, it is possible to diminish the amount of the write current even when the saturated magnetization amount of the memory layer is not diminished, such that the saturated magnetization amount of the memory layer becomes sufficient, and it is possible to sufficiently secure thermal stability of the memory layer.

Particularly, in the memory element according to this embodiment, the memory layer and the magnetization-fixed layer have a magnetization perpendicular to a film face. A configuration having a perpendicular magnetic anisotropy is suitable for low power consumption and a large capacity compared to a configuration having an in-plane magnetic anisotropy. The reason thereof is thought to be because in the case of the perpendicular magnetization, the energy barrier that is to be exceeded during a spin torque magnetization inversion is low, and the thermal stability of the memory layer for retaining information becomes advantageous due to a high magnetic anisotropy which the perpendicular magnetization film possesses.

In addition, according to the configuration of the memory device of the embodiment, the memory element is disposed between the two kinds of interconnects, and a current flows to the memory element in the lamination direction through the two kinds of interconnects, and thereby a spin-polarized electron is injected to the memory element. Therefore, it is possible to perform the recording of information by a spin injection by flowing a current in the lamination direction of the memory element through the two interconnects.

In addition, even when the saturated magnetization amount of the memory layer is not diminished, it is possible to diminish the amount of a write current of the memory element, such that it is possible to stably retain the information recorded in the memory element and it is possible to diminish the power consumption of the memory device.

According to the embodiments, even when the saturated magnetization amount of the memory layer is not diminished, the amount of the write current of the memory element may be diminished, such that the thermal stability representing the information retaining ability is sufficiently secured, and it is possible to configure a memory element excellent in a characteristic balance. Therefore, it is possible to sufficiently obtain an operation margin of the memory element by removing an operation error.

In addition, particularly, when a ferromagnetic material making up the memory layer is set to Co—Fe—B, and a composition of the Co—Fe—B is $(Co_x$—$Fe_y)_{100-z}$—$B_z$, in which $0 \leq Co_x \leq 40$, $60 \leq Fe_y \leq 100$, and $0 < B_z \leq 30$, this is suitable for the formation of the memory layer having the perpendicular magnetization.

Furthermore, when assuming a case where a heat treatment temperature is a relatively high temperature of substantially 350 to 450° C., in a case where the composition of the Co—Fe—B is $(Co_x$—$Fe_y)_{100-z}$—$B_z$, in which $0 \leq Co_x \leq 40$, $60 \leq Fe_y \leq 100$, and $20 < B_z \leq 40$, the ferromagnetic material making up the memory layer shows a high tunnel magnetoresistive effect even under a high-temperature heat treatment, such that this composition is suitable.

Therefore, it is possible to realize a memory device that operates stably with high reliability.

In addition, the write current is diminished, such that it is possible to diminish power consumption during performing the writing into the memory element.

Therefore, it is possible to diminish the power consumption of the entirety of the memory device.

Additional features and advantages are described herein, and will be apparent from the following Detailed Description and the figures.

DETAILED DESCRIPTION

Embodiments of the present application will be described below in detail with reference to the drawings.

Hereinafter, an embodiment will be described in the following order.
1. Outline of Memory Element of Embodiment
2. Configuration of First Embodiment
3. Experiment Related to First Embodiment
4. Configuration of Second Embodiment
5. Experiment Related to Second Embodiment
6. Modification
1. Outline of Memory Element of Embodiment First, outline of a memory element of an embodiment according to the present disclosure will be described.

The embodiment according to the present disclosure performs the recording of information by inverting a magnetization direction of a memory layer of a memory element by the above-described spin injection.

The memory layer is formed of a magnetic material such as ferromagnetic layer, and retains information through the magnetization state (magnetization direction) of the magnetic material.

Figure 2:
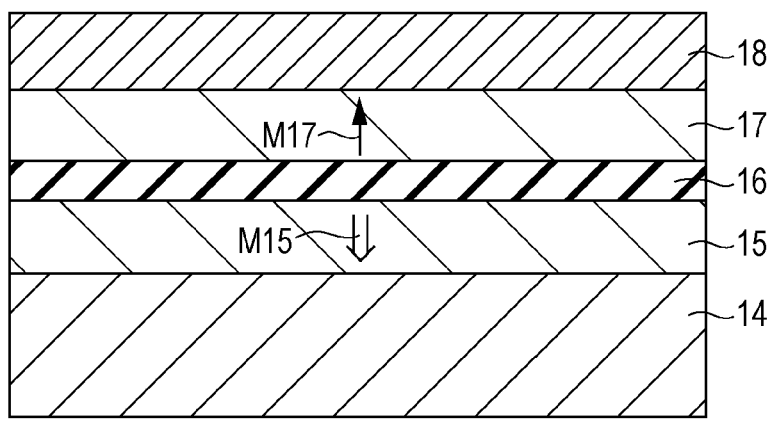
FIG. 2 is a cross-sectional view illustrating a memory element according the embodiment.

It will be described later in detail, but the memory element has a layered structure whose example is shown in FIG. 2, and includes a memory layer 17 and a magnetization-fixed layer 15 as two magnetic layers, and an insulating layer 16 (tunnel insulating layer) as an intermediate layer provided between the two magnetic layers.

The memory layer 17 has a magnetization perpendicular to a film face and a magnetization direction varies corresponding to information.

The magnetization-fixed layer 15 has a magnetization that is a reference for the information stored in the memory layer 17 and is perpendicular to the film face.

The insulating layer 16 is formed of a non-magnetic material and is provided between the memory layer 17 and the magnetization-fixed layer 15.

Spin-polarized electrons are injected in the lamination direction of a laminated structure having the memory layer 17, the insulating layer 16, and the magnetization-fixed layer 15, and the magnetization direction of the memory layer 17 is changed and thereby information is recorded in the memory layer 17.

A basic operation for inverting the magnetization direction of the magnetic layer (memory layer 17) by the spin injection is to make a current of threshold value or more flow to the memory element including a giant magnetoresistive effect element (GMR element) or a tunnel magnetoresistive effect element (MTJ element) in a direction perpendicular to a film face. At this time, the polarity (direction) of the current depends on the inverted magnetization direction.

In a case where a current having an absolute value less than the threshold value is made to flow, magnetization inversion does not occur.

A threshold value Ic of a current, which is necessary when the magnetization direction of the magnetic layer is inverted by spin injection, is expressed by the following equation:

$$Ic = A \cdot \alpha \cdot Ms \cdot V \cdot Hd / 2\eta$$

Here, A: constant, $\alpha$: spin braking constant, $\eta$: spin injection efficiency, Ms: saturated magnetization amount, V: volume of memory layer, and Hd: effective diamagnetic field.

As expressed by this equation, a threshold value of a current may be set to an arbitrary value by controlling the volume V of the magnetic layer, the saturated magnetization amount Ms of the magnetic layer, and the spin injection efficiency $\eta$, and the spin braking constant $\alpha$.

More strictly speaking, the threshold value Ic of the current necessary for inverting a magnetization direction of a magnetic layer using a spin torque magnetization inversion is different depending on whether the easy axis of the magnetization is an in-plane direction or a perpendicular direction.

The memory element according to the embodiment is a perpendicular magnetization type, but when an inversion current, which inverts a magnetization direction of a magnetic layer in the case of an in-plane magnetization type memory element in the related art, is set to Ic_para, in a case where the inversion is performed from the same direction to a reverse direction (in addition, the same direction and the reverse direction are magnetization directions with a magnetization direction of the magnetization-fixed layer given as a reference), Ic_para=$(A \cdot \alpha \cdot Ms \cdot V/g(0)/P)(H_k+2\pi Ms)$.

In addition, when the inversion is performed from the reverse direction to the same direction, Ic_para=$(A \cdot \alpha \cdot Ms \cdot V/g(\pi)/P)(H_k+2\pi Ms)$.

On the other hand, in a case where the inversion current of the perpendicular magnetization type memory element of this embodiment is set to Ic_perp=$(A \cdot \alpha \cdot Ms \cdot V/g(0)/P)(H_k-4\pi Ms)$.

In addition, in the case of inverting from the reverse direction to the same direction, Ic_perp=$(A \cdot \alpha \cdot Ms \cdot V/g(\pi)/P)(H_k-4\pi Ms)$.

Here, A is a constant, $\alpha$ is a damping constant, Ms is a saturated magnetization, P is a spin polarizability, g(0) and g($\pi$) are coefficients corresponding to the efficiency where a spin torque is transferred to a counterpart magnetic layer at the time of the same direction and the reverse direction, respectively, and $H_k$ is a magnetic anisotropy (refer to Nature Materials., 5, 210 (2006)).

In each of the equations, when comparing the case of the perpendicular magnetization ($H_k-4\pi Ms$) and the case of the in-plane magnetization ($H_k+2\pi Ms$), it can be understood that the perpendicular magnetization type is suitable for the low write current.

The memory element of this embodiment performs the reading-out of information using a difference in resistance due to the tunnel magnetoresistive effect. That is, when the tunnel magnetoresistive effect is large, an output also becomes large. The tunnel magnetoresistive effect TMR is expressed by the following equation (1) by using a spin polarizability P.

$$TMR(\%) = \frac{P_1 P_2}{1 - P_1 P_2} \times 100 \quad (1)$$

Here, $P_1$ is a spin polarizability of a magnetization-fixed layer, and $P_2$ is a spin polarizability of a memory layer. As can be seen from the equation (1), when the spin polarizability is large, the TMR becomes large.

In addition, from the comparison with the inversion current equation, it can be understood that the low current and the high output (high TMR) are in a compatible relationship.

In this embodiment, the memory element includes the magnetic layer (memory layer 17) that is capable of retaining information through the magnetization state, and the magnetization-fixed layer 15 whose magnetization direction is fixed.

The memory element has to retain written information so as to function as a memory. This is determined by a value of an index $\Delta$ ($=KV/k_B T$) of thermal stability as an index of ability of maintaining information. The above-described $\Delta$ is expressed by the following equation (2).

$$\Delta = KV/k_B T = Ms \cdot V \cdot H_k \cdot (\tfrac{1}{2} k_B T) \quad (2)$$

Here, $H_k$: effective anisotropy field, $k_B$: Boltzmann's constant, T: temperature, Ms: saturated magnetization amount, and V: volume of memory layer.

The effective anisotropy field $H_k$ receives an effect by a shape magnetic anisotropy, an induced magnetic anisotropy, and a crystal magnetic anisotropy, or the like, and when assuming a coherent rotation model of a single domain, the effective anisotropy field becomes the same as the coercive force.

The index $\Delta$ of the thermal stability and the threshold value Ic of the current are often in a trade-off relationship. Therefore, a compatibility of these becomes an issue to retain the memory characteristic.

In regard to the threshold value of the current that changes the magnetization state of the memory layer 17, actually, for example, in a TMR element in which the thickness of the memory layer 17 is 2 nm, and a planar pattern is substantially an elliptical shape of 100 nm×150 nm, a threshold value +Ic of a positive side is +0.5 mA, a threshold value −Ic of a negative side is −0.3 mA, and a current density at this time is substantially $3.5 \times 10^6$ A/cm². These substantially correspond to the above-described equation of Ic (equation of Ic_para).

On the contrary, in a common MRAM that performs a magnetization inversion using a current magnetic field, a write current of several mA or more is necessary.

Therefore, in case of performing magnetization inversion by spin injection, the threshold value of the above-described write current becomes sufficiently small, such that this is effective for diminishing power consumption of an integrated circuit.

Figure 10:
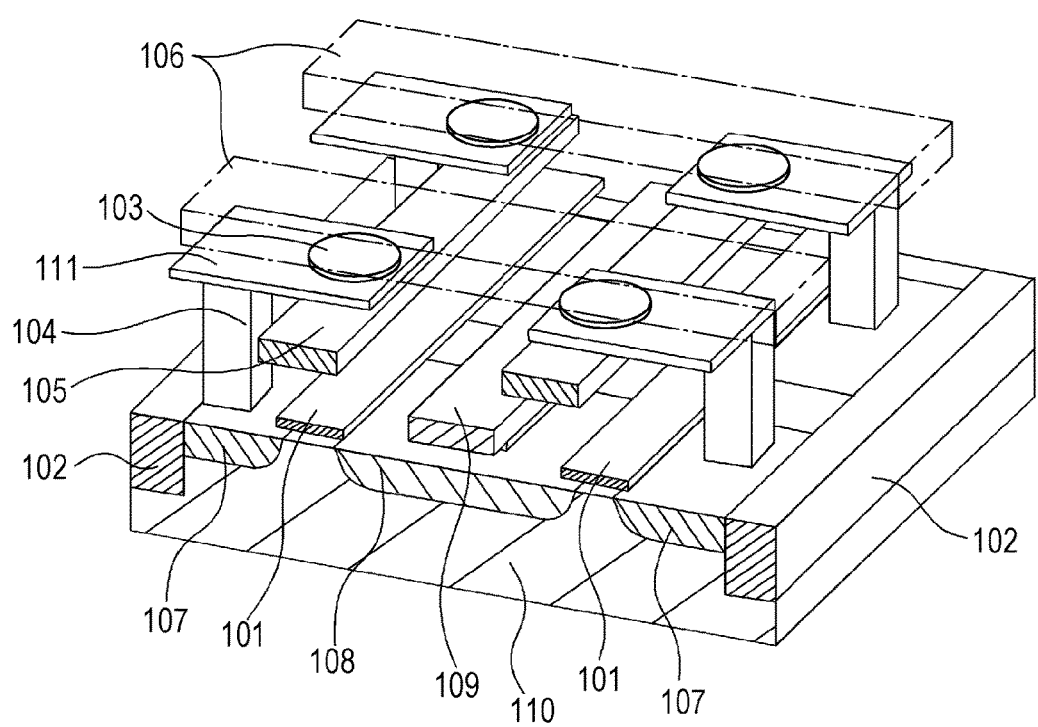
FIG. 10 is a perspective view schematically illustrating a configuration of an MRAM in the related art.
Figure 11:
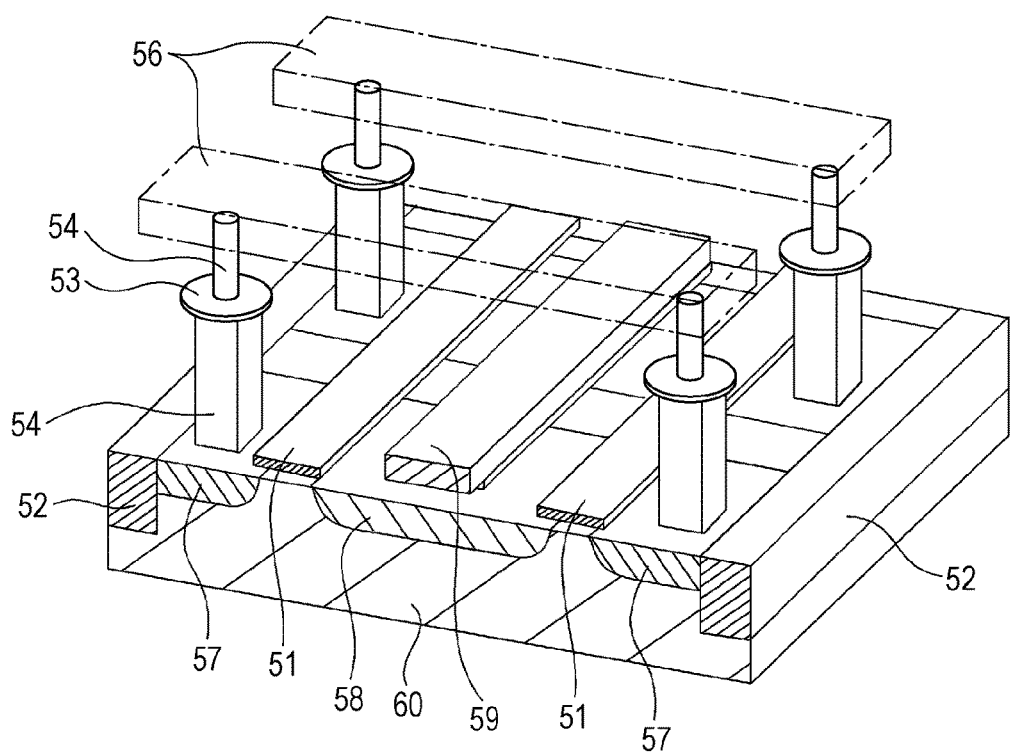
FIG. 11 is an explanatory view illustrating a schematic configuration of a memory device using a magnetization inversion through a spin injection.
Figure 12:
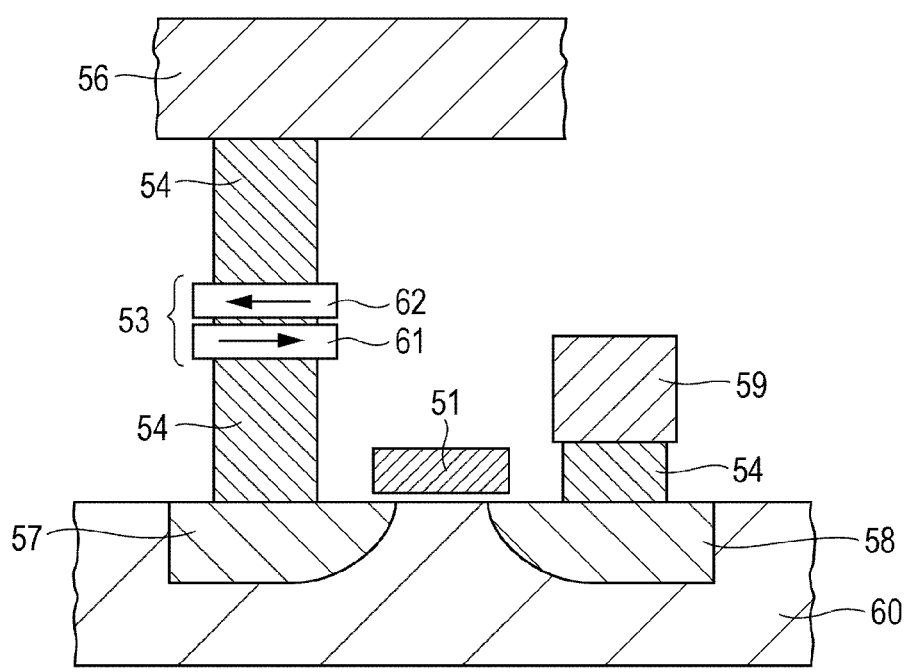
FIG. 12 is a cross-sectional view of the memory device of FIG. 11.

In addition, an interconnect (interconnect 105 of FIG. 10) for the generation of the current magnetic field, which is necessary for a common MRAM, is not necessary, such that in regard to the degree of integration, it is advantageous compared to the common MRAM.

In the case of performing the magnetization inversion by spin injection, since the writing (recording) of information is performed by directly flowing a current to the memory element, to select a memory cell that performs the writing, the memory element is connected to a selection transistor to construct the memory cell.

In this case, the current flowing to the memory element is restricted to a current magnitude (saturated current of the selection transistor) that can be made to flow to the selection transistor.

To make the threshold value Ic of a current of the magnetization inversion using the spin injection smaller than the saturated current of the selection transistor, as can be seen from the equation of Ic, it is effective to diminish the saturated magnetization amount Ms of the memory layer 17.

However, in the case of simply diminishing the saturated magnetization amount Ms (for example, U.S. Patent Application Publication No. 2005/0184839 A1), the thermal stability of the memory layer 17 is significantly deteriorated, and therefore it is difficult for the memory element to function as a memory.

To construct the memory, it is necessary that the index $\Delta$ of the thermal stability is equal to or greater than a magnitude of a certain degree.

The present inventors have made various studies, and as a result thereof, they have found that when for example, a composition of Co—Fe—B is selected as the ferromagnetic layer making up the memory layer 17, the magnitude of the effective diamagnetic field ($M_{effective}$) which the memory layer 17 receives becomes smaller than the saturated magnetization amount Ms of the memory layer 17.

By using the above-described ferromagnetic material, the magnitude of the effective diamagnetic field which the memory layer 17 receives becomes smaller than the saturated magnetization amount Ms of the memory layer 17.

In this manner, it is possible to make the diamagnetic field which the memory layer 17 receives small, such that it is possible to obtain an effect of diminishing the threshold value Ic of a current expressed by the equation of Ic without deteriorating the thermal stability $\Delta$ expressed by the equation (2).

In addition, the present inventors has found that Co—Fe—B magnetizes in a direction perpendicular to a film face within a restricted composition range of the selected Co—Fe—B composition, and due to this, it is possible to secure a sufficient thermal stability even in the case of a extremely minute memory element capable of realizing Gbit class capacity.

Therefore, in regard to a spin injection type magnetization inversion memory, in a state where the thermal stability is secured in the spin injection-type magnetization inversion memory of the Gbit class, it is possible to make a stable memory in which information may be written with a low current.

In this embodiment, it is configured such that the magnitude of the effective diamagnetic field which the memory layer 17 receives is made to be less than the saturated magnetization amount Ms of the memory layer 17, that is, a ratio of the magnitude of the effective diamagnetic field with respect to the saturated magnetization amount Ms of the memory layer 17 becomes less than 1.

In addition, a magnetic tunnel junction (MTJ) element is configured by using a tunnel insulating layer (insulating layer 16) formed of an insulating material as the non-magnetic intermediate layer disposed between the memory layer 17 and the magnetization-fixed layer 15 in consideration of the saturated current value of the selection transistor.

The magnetic tunnel junction (MTJ) element is configured by using the tunnel insulating layer, such that it is possible to make a magnetoresistance change ratio (MR ratio) large compared to a case where a giant magnetoresistive effect (GMR) element is configured by using a nonmagnetic conductive layer, and therefore it is possible to increase the read-out signal strength.

Particularly, when magnesium oxide (MgO) is used as the material of the tunnel insulating layer 16, it is possible to make the magnetoresistance change ratio (MR ratio) large compared to a case where aluminum oxide, which can be generally used, is used.

In addition, generally, spin injection efficiency depends on the MR ratio, and the larger the MR ratio, the more spin injection efficiency is improved, and therefore it is possible to diminish the magnetization inversion current density.

Therefore, when magnesium oxide is used as the material of the tunnel insulating layer 16 and the memory layer 17 is used, it is possible to diminish the threshold write current by spin injection and therefore it is possible to perform the writing (recording) of information with a small current. In addition, it is possible to increase the read-out signal strength.

In this manner, it is possible to diminish the threshold write current by spin injection by securing the MR ratio (TMR ratio), and it is possible to perform the writing (recording) of information with a small current. In addition, it is possible to increase the read-out signal strength.

As described above, in a case where the tunnel insulating layer 16 is formed of the magnesium oxide (MgO) film, it is desirable that the MgO film be crystallized and therefore a crystal orientation be maintained in 001 direction.

In addition, in this embodiment, in addition to a configuration formed of the magnesium oxide, the intermediate layer (tunnel insulating layer 16) between the memory layer 17 and the magnetization-fixed layer 15 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O.

An area resistance value of the tunnel insulating layer 16 is necessary to be controlled to several tens $\Omega\mu m^2$ or less in consideration of the viewpoint of obtaining a current density necessary for inverting the magnetization direction of the memory layer 17 by spin injection.

In the tunnel insulating layer 16 formed of the MgO film, to retain the area resistance value within the above-described range, it is necessary to set the film thickness of the MgO film to 1.5 nm or less.

In addition, it is desirable to make the memory element small to easily invert the magnetization direction of the memory layer 17 with a small current.

Therefore, preferably, the area of the memory element is set to 0.01 $\mu m^2$ or less.

In addition, in this embodiment, the memory layer 17 may be formed by directly laminating another ferromagnetic layer having a different composition. In addition, a ferromagnetic layer and a soft magnetic layer may be laminated, or a plurality of ferromagnetic layers may be laminated through a soft magnetic layer or a non-magnetic layer interposed therebetween. Even in the case of laminating in this manner, an effect may be obtained.

Particularly, in a case where the memory layer 17 is configured by laminating the plurality of ferromagnetic layers through the non-magnetic layer, it is possible to adjust the strength of interaction between the ferromagnetic layers, such that even when the dimensions of the memory element are under sub-micron, there is obtained an effect of controlling magnetization inversion current so that it does not become large. As a material of the non-magnetic layer in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

It is desirable that the magnetization-fixed layer 15 and the memory layer 17 have a unidirectional anisotropy.

In addition, it is preferable that the film thickness of each of the magnetization-fixed layer 15 and the memory layer 17 be 0.5 to 30 nm.

Other configuration of the memory element may be the same as the configuration of a memory element that records information by spin injection in the related art.

The magnetization-fixed layer 15 may be configured in such a manner that the magnetization direction is fixed by only a ferromagnetic layer or by using an anti-ferromagnetic combination of an anti-ferromagnetic layer and a ferromagnetic layer.

In addition, the magnetization-fixed layer 15 may be configured by a single layer of a ferromagnetic layer, or a ferri-pin structure in which a plurality of ferromagnetic layers are laminated through a non-magnetic layer.

As a material of the ferromagnetic layer making up the magnetization-fixed layer 15 of the laminated ferri-pin structure, Co, CoFe, CoFeB, or the like may be used. In addition, as a material of the non-magnetic layer, Ru, Re, Ir, Os, or the like may be used.

As a material of the anti-ferromagnetic layer, a magnetic material such as an FeMn alloy, a PtMn alloy, a PtCrMn alloy, an NiMn alloy, an IrMn alloy, NiO, and $Fe_2O_3$ may be exemplified.

In addition, a magnetic characteristic may be adjusted by adding a non-magnetic element such as Ag, Cu, Au, Al, Si, Bi, Ta, B, C, O, N, Pd, Pt, Zr, Hf, Ir, W, Mo, and Nb to the above-described magnetic materials, or in addition to this, various physical properties such as a crystalline structure, a crystalline property, a stability of a substance, or the like may be adjusted.

In addition, in relation to a film configuration of the memory element, the memory layer 17 may be disposed at the lower side of the magnetization-fixed layer 15, or at the upper side thereof, and in any disposition, there is no problem at all. In addition, there is no problem at all in a case where the magnetization-fixed layer 15 is disposed at the upper side and the lower side of the memory layer 17, so-called dual-structure.

In addition, as a method of reading-out information recorded in the memory layer 17 of the memory element, a magnetic layer that becomes a reference for the information is provided on the memory layer 17 of the memory element through a thin insulating film, and the reading-out may be performed by a ferromagnetic tunnel current flowing through the insulating layer 16, or the reading-out may be performed by a magnetoresistive effect.

2. Configuration of First Embodiment

Subsequently, a specific configuration of the first embodiment will be described.

Figure 1:
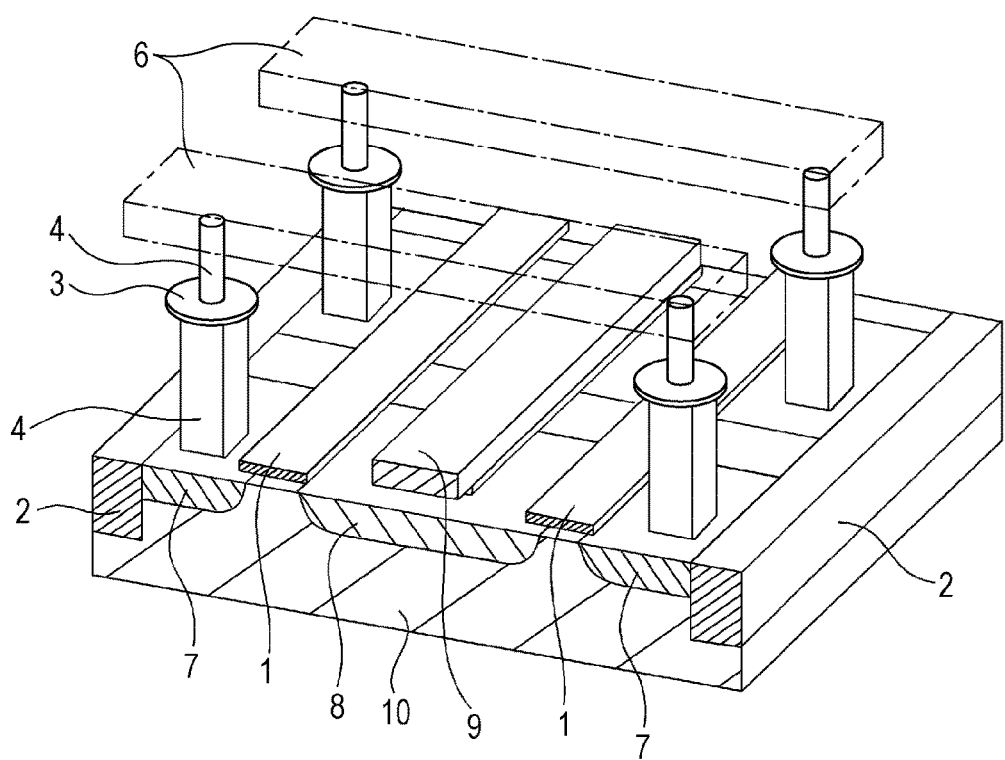
FIG. 1 is an explanatory view illustrating a schematic configuration of a memory device according to an embodiment.

As an embodiment, a schematic configuration diagram (perspective view) of a memory device is shown in FIG. 1.

This memory device includes a memory element 3, which can retain information at a magnetization state, disposed in the vicinity of an intersection of two kinds of address interconnects (for example, a word line and a bit line) that are perpendicular to each other.

Specifically, a drain region 8, a source region 7, and a gate electrode 1 that make up a selection transistor that selects each memory cell are formed in a portion separated by an element separation layer 2 of a semiconductor substrate 10 such as a silicon substrate, respectively. Among them, the gate electrode 1 also functions as one side address interconnect (for example, a word line) that extends in the front-back direction in the drawing.

The drain region 8 is formed commonly with left and right selection transistors in the drawing, and an interconnect 9 is connected to the drain region 8.

The memory element 3 is disposed between the source region 7, and the other side address interconnect (for example, a bit line) 6 that is disposed at the upper side and extends in the left-right direction in the drawing. This memory element 3 has a memory layer including a ferromagnetic layer whose magnetization direction is inverted by spin injection.

In addition, the memory element 3 is disposed in the vicinity of an intersection of two kinds of address interconnects 1 and 6.

The memory element 3 is connected to the bit line 6 and the source region 7 through upper and lower contact layers 4, respectively.

In this manner, a current flows into the memory element 3 in the perpendicular direction thereof through the two kind of address interconnects 1 and 6, and the magnetization direction of the memory layer may be inverted by a spin injection.

In addition, a cross-sectional view of the memory element 3 of the memory device according to this embodiment is shown in FIG. 2.

As shown in FIG. 2, in the memory element 3, an underlying layer 14, the magnetization-fixed layer 15, the insulating layer 16, the memory layer 17, and the cap layer 18 are laminated in this order from a lower layer side.

In this case, the magnetization-fixed layer 15 is provided at a lower layer in relation to a memory layer 17 in which the magnetization direction of a magnetization M17 is inverted by a spin injection.

In regard to the spin injection type magnetization inversion memory, "0" and "1" of information are defined by a relative angle between the magnetization M17 of the memory layer 17 and a magnetization M15 of the magnetization-fixed layer 15.

An insulating layer 16 that serves as a tunnel barrier layer (tunnel insulating layer) is provided between the memory layer 17 and the magnetization-fixed layer 15, and therefore an MTJ element is configured by the memory layer 17 and the magnetization-fixed layer 15.

In addition, an underlying layer 14 is formed under the magnetization-fixed layer 15, and a cap layer 18 is formed on the memory layer 17.

The memory layer 17 is formed of a ferromagnetic material having a magnetic moment in which the direction of a magnetization M17 is freely changed in a direction perpendicular to a film face. The magnetization-fixed layer 15 is formed of a ferromagnetic material having a magnetic moment in which a magnetization M15 is fixed in the direction perpendicular to the film face.

The storage of information is performed by a magnetization direction of the memory layer 17 having a unidirectional anisotropy. The writing of information is performed by applying a current in the direction perpendicular to the film face and by causing a spin torque magnetization inversion. In this way, the magnetization-fixed layer 15 is provided at a lower layer in relation to the memory layer 17 in which the magnetization direction is inverted by the spin injection, and serves as a reference of memory information (magnetization direction) of the memory layer 17.

In this embodiment, Co—Fe—B is used for the memory layer 17 and the magnetization-fixed layer 15.

Particularly, the composition of the Co—Fe—B is set to $(Co_x-Fe_y)_{100-z}-B_z$, in which $0 \le Co_x \le 40$, $60 \le Fe_y \le 100$, and $0 < B_z \le 30$.

The magnetization-fixed layer 15 serves as the reference for the information, such that it is necessary that the magnetization direction does not vary, but it is not necessarily necessary to be fixed in a specific direction. The magnetization-fixed layer 15 may be configured in such a manner that migration becomes more difficult than in the memory layer 17 by making a coercive force large, by making the film thickness large, or by making a damping constant large compared to the memory layer 17.

In the case of fixing the magnetization, an anti-ferromagnetic material such as PtMn and IrMn may be brought into contact with the magnetization-fixed layer 15, or a magnetic material brought into contact with such an anti-ferromagnetic material may be magnetically combined through a non-magnetic material such as Ru, and thereby the magnetization-fixed layer 15 may be indirectly fixed.

In this embodiment, particularly, a composition of the memory layer 17 of the memory element 3 is adjusted such that a magnitude of an effective diamagnetic field which the memory layer 17 receives becomes smaller than a saturated magnetization amount Ms of the memory layer 17.

That is, as described above, a composition of a ferromagnetic material Co—Fe—B of the memory layer 17 is selected, and the magnitude of the effective diamagnetic field which the memory layer 17 receives is made to be small, such that the magnitude of the effective diamagnetic field becomes smaller than the saturated magnetization amount Ms of the memory layer 17.

In addition, in this embodiment, in a case where the insulating layer 16 that is an intermediate layer is formed of a magnesium oxide layer. In this case, it is possible to make a magnetoresistive change ratio (MR ratio) high.

When the MR ratio is made to be high as described above, the spin injection efficiency is improved, and therefore it is possible to diminish a current density necessary for inverting the direction of the magnetization M17 of the memory layer 17.

The memory element 3 of this embodiment can be manufactured by continuously forming from the underlying layer 14 to the cap layer 18 in a vacuum apparatus, and then by forming a pattern of the memory element 3 by a processing such as a subsequent etching or the like.

According to the above-described embodiment, the memory layer 17 of the memory element 3 is configured in such a manner that the magnitude of the effective diamagnetic field that the memory layer 17 receives is smaller than the saturated magnetization amount Ms of the memory layer 17, such that the diamagnetic field that the memory layer 17 receives is decreased, and it is possible to diminish an amount of a write current necessary for inverting the direction of the magnetization M17 of the memory layer 17.

On the other hand, since the amount of the write current may be diminished even when the saturated magnetization amount Ms of the memory layer 17 is not diminished, it is possible to sufficiently secure the amount of the saturated magnetization of the memory layer 17 and therefore it is possible to sufficiently secure the thermal stability of the memory layer 17.

As described above, since it is possible to sufficiently secure the thermal stability that is an information retaining ability, it is possible to configure the memory element 3 excellent in a characteristic balance.

In this manner, an operation error is removed and an operation margin of the memory element 3 is sufficiently obtained, such that it is possible to stably operate the memory element 3.

Accordingly, it is possible to realize a memory that operates stably with high reliability.

In addition, the write current is diminished, such that it is possible to diminish the power consumption when performing the writing into the memory element 3.

Therefore, it is possible to diminish the power consumption of the entirety of the memory device in which a memory cell is configured by the memory element 3 of this embodiment.

Therefore, in regard to the memory device including the memory element 3 capable of realizing a memory device that is excellent in information retaining ability, has high reliability, and operates stably, it is possible to diminish the power consumption in a memory device including the memory element.

In addition, the memory device that includes a memory element 3 shown in FIG. 2 and has a configuration shown in FIG. 1 has an advantage in that a general semiconductor MOS forming process may be applied when the memory device is manufactured.

Therefore, it is possible to apply the memory of this embodiment as a general purpose memory.

3. Experiment Related to First Embodiment

Here, in regard to the configuration of the memory element of this embodiment, by specifically selecting the material of the ferromagnetic layer making up the memory layer 17, the magnitude of the effective diamagnetic field that the memory layer 17 receives was adjusted, and thereby a sample of the memory element 3 was manufactured, and then characteristics thereof was examined.

In an actual memory device, as shown in FIG. 1, a semiconductor circuit for switching or the like present in addition to the memory element 3, but here, the examination was made on a wafer in which only the memory element is formed for the purpose of investigating a magnetization inversion characteristic of the memory layer 17.

Experiment 1

A thermal oxide film having a thickness of 300 nm was formed on a silicon substrate having a thickness of 0.725 mm, and the memory element 3 having a configuration shown in FIG. 2 was formed on the thermal oxide film.

Figure 3:
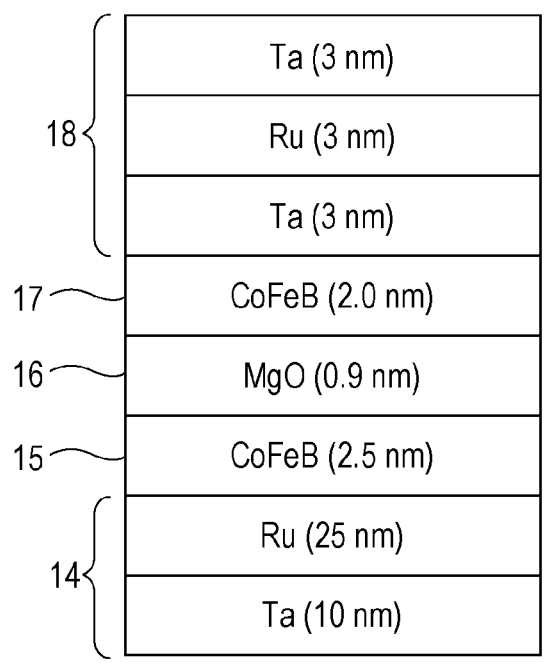
FIG. 3 is an explanatory view illustrating a layer structure of a sample of a memory element used for an experiment.

Specifically, in regard to the memory element 3 shown in FIG. 2, a material and a film thickness of each layer were selected as shown in FIG. 3.

Underlying layer 14: Laminated film of a Ta film having a film thickness of 10 nm and a Ru film having a film thickness of 25 nm Magnetization-fixed layer 15: CoFeB film having a film thickness of 2.5 nm Tunnel insulating layer 16: Magnesium oxide film having a film thickness of 0.9 nm Memory layer 17: CoFeB film having the same composition as that of the magnetization-fixed layer Cap layer 18: Laminated film of a Ta film having a film thickness of 3 nm, a Ru film having a thickness of 3 nm, and a Ta film having a thickness of 3 nm Each layer was selected as described above, a Cu film (not shown) having a film thickness of 100 nm (serving as a word line described below) was provided between the underlying layer 14 and the silicon substrate.

In the above-described configuration, the ferromagnetic layer of the memory layer 17 was formed of a ternary alloy of Co—Fe—B, and a film thickness of the ferromagnetic layer was fixed to 2.0 nm.

Each layer other than the insulating layer 16 formed of a magnesium oxide film was formed using a DC magnetron sputtering method.

The insulating layer 16 formed of the magnesium oxide (MgO) film was formed using a RF magnetron sputtering method.

In addition, after forming each layer of the memory element 3, a heating treatment was performed in a magnetic field heat treatment furnace.

Next, after masking a word line portion by a photolithography, a selective etching by Ar plasma was performed with respect to a laminated film other than the word line portion, and thereby the word line (lower electrode) was formed.

At this time, a portion other than the word line was etched to the depth of 5 nm in the substrate.

Then, a mask of a pattern of the memory element 3 by an electron beam drawing apparatus was formed, a selective etching was performed with respect to the laminated film, and thereby the memory element 3 was formed. A portion other than the memory element 3 was etched to a portion of the word line immediately over the Cu layer.

In addition, in the memory element for the characteristic evaluation, it is necessary to make a sufficient current flow to the memory element so as to generate a spin torque necessary for the magnetization inversion, such that it is necessary to suppress the resistance value of the tunnel insulating layer. Therefore, a pattern of the memory element 3 was set to an elliptical shape having a short axis of 0.09 μm×a long axis of 0.18 μm, and an area resistance value ($\Omega\mu m^2$) of the memory element 3 was set to 20 $\Omega\mu m^2$.

Next, a portion other than the memory element 3 was insulated by sputtering $Al_2O_3$ to have a thickness of substantially 100 nm.

Then, a bit line serving as an upper electrode and a measurement pad were formed by using photolithography.

In this manner, a sample of the memory element 3 was manufactured.

By the above-described manufacturing method, each sample of the memory element 3 in which a composition of Co—Fe—B alloy of the ferromagnetic layer of the memory layer 17 was changed was manufactured.

In the composition of the Co—Fe—B alloy, a composition ratio (atomic %) of CoFe and B was fixed to 80:20, and a composition ratio of Co in CoFe, that is, x (atomic %) was changed to 90%, 80%, 70%, 60%, 50%, 40%, 30%, 20%, 10%, and 0%.

With respect to each sample of the memory element 3 manufactured as described above, a characteristic evaluation was performed as described below.

Before the measurement, it was configured to apply a magnetic field to the memory element 3 from the outside to control an inversion current in such a manner that a value in a plus direction and a value in a minus direction to be symmetric to each other.

In addition, a voltage applied to the memory element 3 was set up to 1 V within a range without breaking down the insulating layer 16.

Measurement of Saturated Magnetization Amount

The saturated magnetization amount Ms was measured by a VSM measurement using a Vibrating Sample Magnetometer.

Measurement of Effective Diamagnetic Field

As a sample for measuring an effective diamagnetic field, in addition to the above-described sample of the memory element 3, a sample in which each layer making up the memory element 3 was formed was manufactured and then the sample was processed to have a planar pattern of 20 mm×20 mm square.

In addition, a magnitude $M_{effective}$ of an effective diamagnetic field was obtained by FMR (Ferromagnetic Resonance) measurement.

A resonance frequency fFMR, which is obtained by the FMR measurement, with respect to arbitrary external magnetic field $H_{ex}$ is given by the following equation (3).

$$f_{FMR} = \gamma' \sqrt{4\pi M_{\text{effective}}(H_K + H_{ex})} \quad (3)$$

Here, $M_{effective}$ in the equation (3) may be expressed by $4\pi M_{effective} = 4\pi Ms - H\perp$ (H⊥: anisotropy field in a direction perpendicular to a film face).

Measurement of Inversion Current Value and Thermal Stability

An inversion current value was measured for the purpose of evaluating the writing characteristic of the memory element 3 according to this embodiment.

A current having a pulse width of 10 μs to 100 ms is made to flow to the memory element 3, and then a resistance value of the memory element 3 was measured.

In addition, the amount of current that flows to the memory element 3 was changed, and then a current value at which a direction of the magnetization M17 of the memory layer 17 of the memory element 3 was inverted was obtained. A value obtained by extrapolating a pulse width dependency of this current value to a pulse width 1 ns was set to the inversion current value.

In addition, the inclination of a pulse width dependency of the inversion current value corresponds to the above-described index Δ of the thermal stability of the memory element 3. The less the inversion current value is changed (the inclination is small) by the pulse width, the more the memory element 3 is strengthened against thermal disturbance.

In addition, twenty memory elements 3 with the same configuration were manufactured to take variation in the memory element 3 itself into consideration, the above-described measurement was performed, and an average value of the inversion current value and the index Δ of the thermal stability were obtained.

In addition, an inversion current density Jc0 was calculated from the average value of the inversion current value obtained by the measurement and an area of the planar pattern of the memory element 3.

In regard to each sample of the memory element 3, a composition of Co—Fe—B alloy of the memory layer 17, measurement results of the saturated magnetization amount Ms and the magnitude $M_{effective}$ of the effective diamagnetic field, and a ratio $M_{effective}$/Ms of effective diamagnetic field to the saturated magnetization amount were shown in Table 1. Here, an amount of Co of Co—Fe—B alloy of the memory layer 17 described in Table 1 was expressed by an atomic %.

TABLE 1

| | Ms (emu/cc) | Meffective (emu/cc) | Meffective/Ms |
|---|---|---|---|
| $(Co_{90}Fe_{10})_{80}-B_{20}$ | 960 | 1210 | 1.26 |
| $(Co_{80}Fe_{20})_{80}-B_{20}$ | 960 | 1010 | 1.05 |
| $(Co_{70}Fe_{30})_{80}-B_{20}$ | 1040 | 900 | 0.87 |
| $(Co_{60}Fe_{40})_{80}-B_{20}$ | 1200 | 830 | 0.69 |
| $(Co_{50}Fe_{50})_{80}-B_{20}$ | 1300 | 690 | 0.53 |
| $(Co_{40}Fe_{60})_{80}-B_{20}$ | 1300 | 500 | 0.38 |
| $(Co_{30}Fe_{70})_{80}-B_{20}$ | 1260 | 390 | 0.31 |
| $(Co_{20}Fe_{80})_{80}-B_{20}$ | 1230 | 360 | 0.29 |
| $(Co_{10}Fe_{90})_{80}-B_{20}$ | 1200 | 345 | 0.29 |
| $Fe_{80}-B_{20}$ | 1160 | 325 | 0.28 |

From the table 1, in a case where the amount x of Co in $(Co_xFe_{100-x})_{80}B_{20}$ was 70% or less, the magnitude of the effective diamagnetic field ($M_{effective}$) was smaller than the saturated magnetization amount Ms, that is, the ratio of $M_{effective}$/Ms in a case where the amount x of Co was 70% or less became a value less than 1.0.

In addition, it was confirmed that the more the amount x of Co decreased, the larger the difference between $M_{effective}$ and Ms.

Figure 4:
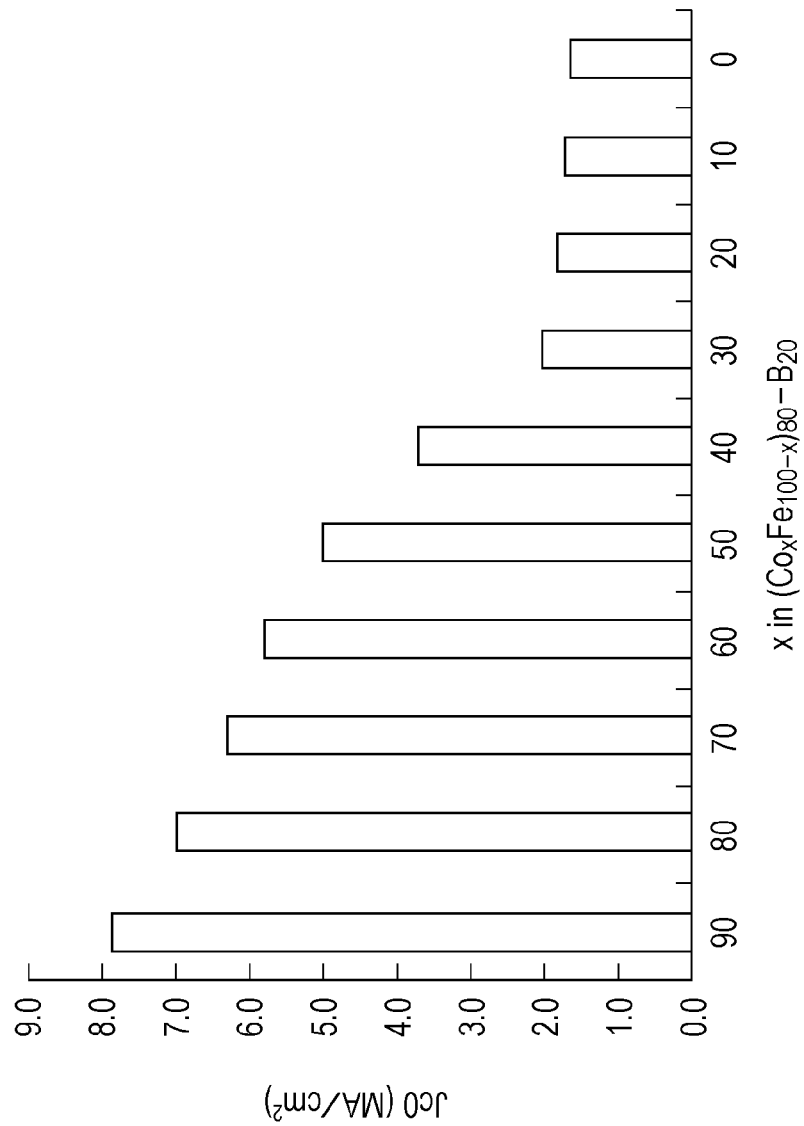
FIG. 4 is a diagram illustrating a relationship between an amount of Co of a memory layer of 0.09×0.18 μm size and an inversion current density.
Figure 5:
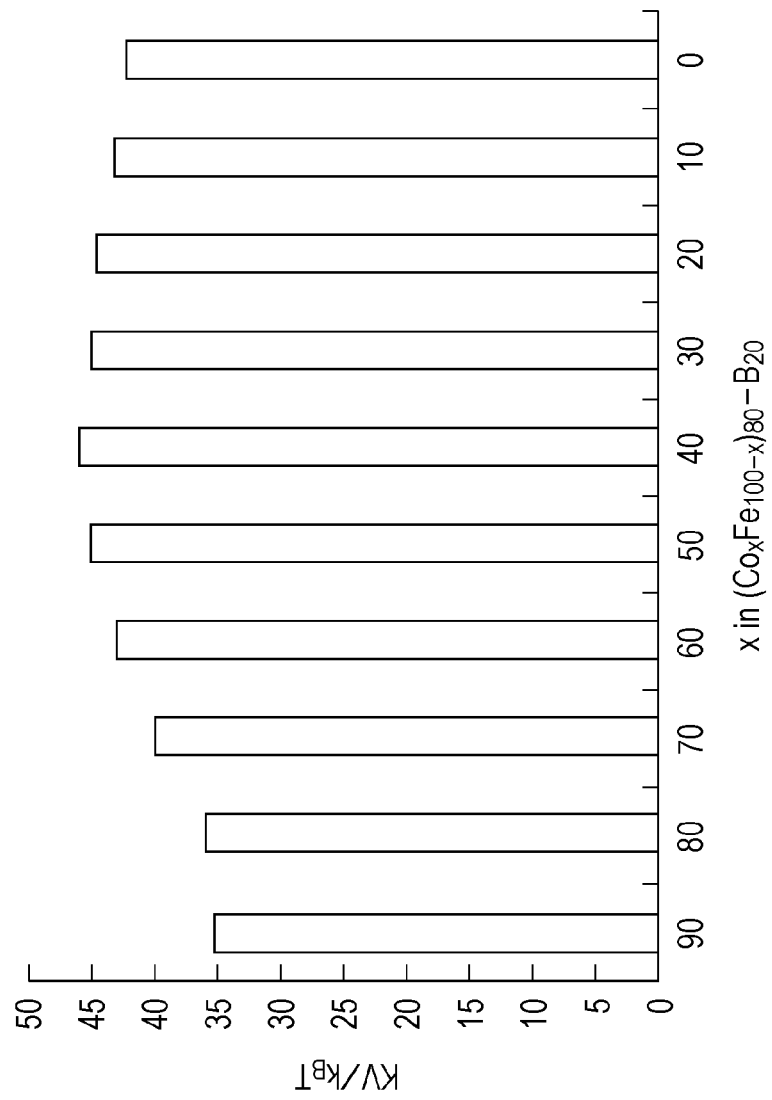
FIG. 5 is a diagram illustrating a relationship between an amount of Co of a memory layer of 0.09×0.18 μm size and an index of thermal stability.

A measurement result of the inversion current value was shown in FIG. 4, and a measurement result of the index of the thermal stability was shown in FIG. 5.

FIG. 4 shows a relationship between the amount x (content in CoFe; atomic %) of Co in the Co—Fe—B alloy of the memory layer 17 and the inversion current density Jc0 obtained from the inversion current value.

FIG. 5 shows a relationship between an amount x (content in CoFe; atomic %) of Co of the Co—Fe—B alloy of the memory layer 17 and the index $\Delta(KV/k_BT)$ of the thermal stability.

As can be seen from FIG. 4, as the amount x of Co decreases, the inversion current density Jc0 decreases.

This is because in a case where an amount x of Co becomes small, the saturated magnetization amount Ms increases, but the magnitude of the effective diamagnetic field $M_{effective}$ decreases, and therefore the product of them $Ms \times M_{effective}$ becomes small.

As can be seen from FIG. 5, as the amount x of Co decreased, the index Δ ($=KV/k_BT$) of the thermal stability increased, and in a case where the amount x of Co became more or less small to some degree, the index Δ of the thermal stability became stable to a large value.

This well corresponds to a change that is expected from the measurement result of the saturated magnetization amount Ms shown in Table 1 and a tendency where the index Δ of the thermal stability from the equation (2) is proportional to the saturated magnetization amount Ms.

As was clear from the results of Table 1, FIGS. 4 and 5, in a composition where the amount x of Co was 70% or less and the effective diamagnetic field $M_{effective}$ was less than the saturated magnetization amount Ms, it was possible to diminish the inversion current value Jc0 while maintaining a high thermal stability, without using a method in which Ms was decreased and therefore the thermal stability was sacrificed.

Experiment 2

As can be seen from the experiment 1, in the case of $(Co_xFe_{100-x})_{80}B_{20}$, it was possible to diminish the inversion current value Jc0 while maintaining a high thermal stability in a composition where the amount x of Co was 70% or less.

Therefore, in experiment 2, an effect on a ratio of Co and Fe, and the $M_{effective}$/Ms, which was caused by an amount of B, was examined by using a memory layer 17 having a composition $(Co_{70}Fe_{30})_{80}B_z$ and a composition $(Co_{80}Fe_{20})_{80}B_z$. The details of a sample were substantially the same as those in the experiment 1.

Table 2 shows compositions of CoFeB alloy in which the amount of B was set to 5 to 40% in $(Co_{70}Fe_{30})_{100-z}B_z$, results of measurement of the saturated magnetization amount Ms and the magnitude $M_{effective}$ of the effective diamagnetic field, and a ratio $M_{effective}$/Ms of the saturated magnetization amount and the magnitude of the effective diamagnetic field.

In addition, Table 3 shows compositions of CoFeB alloy in which the amount z (atomic %) of B was similarly set to 5 to 40% in $(Co_{80}Fe_{20})_{100-z}B_z$, and a ratio $M_{effective}$/Ms of the saturated magnetization amount Ms and the magnitude $M_{effective}$ of the effective diamagnetic field.

TABLE 2

|  | Ms (emu/cc) | Meffective (emu/cc) | Meffective/Ms |
|---|---|---|---|
| $(Co_{70}Fe_{30})_{95}$—$B_5$ | 1310 | 1090 | 0.83 |
| $(Co_{70}Fe_{30})_{90}$—$B_{10}$ | 1250 | 1080 | 0.89 |
| $(Co_{70}Fe_{30})_{80}$—$B_{20}$ | 1040 | 900 | 0.87 |
| $(Co_{70}Fe_{30})_{70}$—$B_{30}$ | 820 | 730 | 0.89 |
| $(Co_{70}Fe_{30})_{60}$—$B_{40}$ | 450 | 690 | 1.53 |

TABLE 3

|  | Ms (emu/cc) | Meffective (emu/cc) | Meffective/Ms |
|---|---|---|---|
| $(Co_{80}Fe_{20})_{95}$—$B_5$ | 1250 | 1280 | 1.02 |
| $(Co_{80}Fe_{20})_{90}$—$B_{10}$ | 1100 | 1140 | 1.04 |
| $(Co_{80}Fe_{20})_{80}$—$B_{20}$ | 960 | 1010 | 1.05 |
| $(Co_{80}Fe_{20})_{70}$—$B_{30}$ | 750 | 890 | 1.19 |
| $(Co_{80}Fe_{20})_{60}$—$B_{40}$ | 430 | 690 | 1.60 |

From the results of Table 2, it can be confirmed that in a case where the ratio of Co and Fe was set to 70/30 like $(Co_{70}Fe_{30})_{100-z}B_z$, the magnitude $M_{effective}$ of the effective diamagnetic field was smaller than the saturated magnetization amount Ms in compositions other than a composition where the amount z of B was 40 atomic %.

From the results of Table 3, it could be confirmed that in a case where the ratio of Co and Fe was set to 80/20 like $(Co_{80}Fe_{20})_{100-z}B_z$, the magnitude $M_{effective}$ of the effective diamagnetic field was larger than the saturated magnetization amount Ms in all compositions.

From the results of the above-described Tables 1 to 3, it was revealed that in a case where the amount of B is within a range of 30 atomic % or less, a magnitude correlation of the saturated magnetization amount Ms and the magnitude $M_{effective}$ of the effective diamagnetic field is determined by the ratio of Co and Fe.

Therefore, a composition of the Co—Fe—B alloy where the magnitude $M_{effective}$ of the effective diamagnetic field is less than the saturated magnetization amount Ms is as follows:

$(Co_x—Fe_y)_{100-z}—B_z$,

Here, $0 \leq Co_x \leq 70$,
$30 \leq Fe_y \leq 100$,
$0 < B_z \leq 30$.

Experiment 3

In a spin injection type memory of Gbit class, it was assumed that the size of the memory element is 100 nmφ. Therefore, in experiment 3, the thermal stability was evaluated by using a memory element having the size of 50 nmφ.

In the composition of Co—Fe—B alloy, a composition ratio (atomic %) of CoFe and B was fixed to 80:20, and a composition ratio x (atomic %) of Co in CoFe was changed to 90%, 80%, 70%, 60%, 50%, 40%, 30%, 20%, 10%, and 0%.

The details of the sample other than the sample size were substantially the same as those in the experiment 1.

Figure 6:
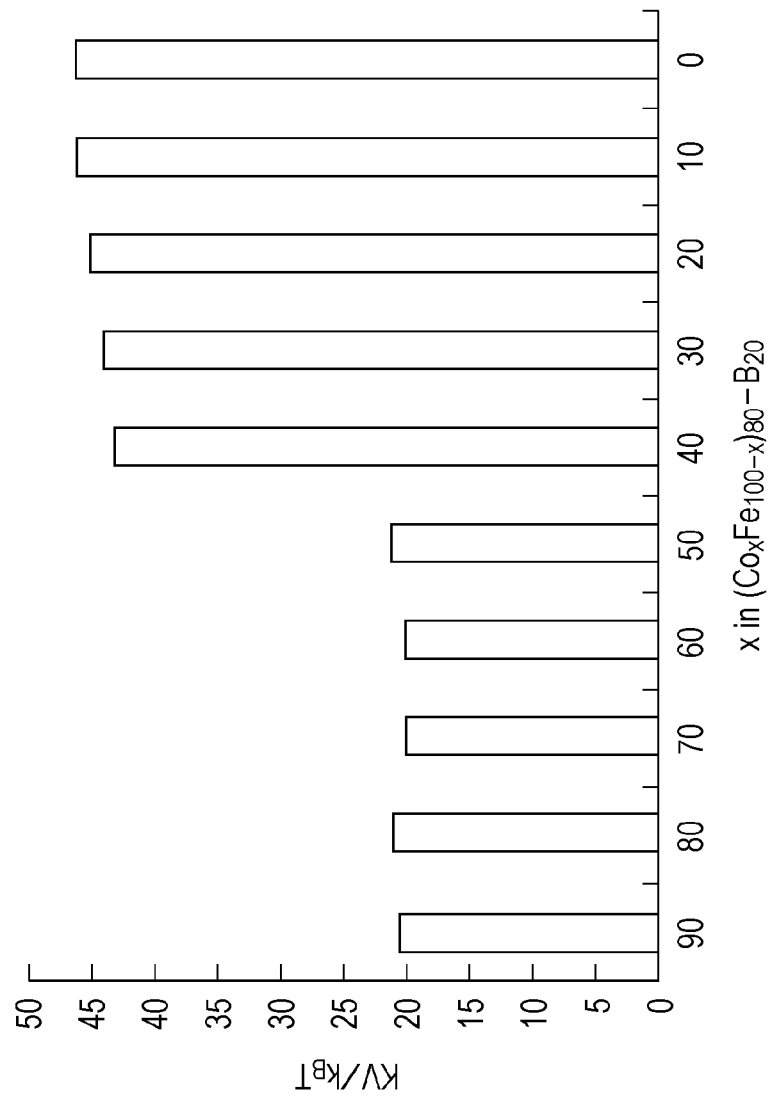
FIG. 6 is a diagram illustrating a relationship between an amount of Co of a memory layer of 50 nm ϕ size and an index of thermal stability.

In a case where the size of the memory element 3 was 50 nmφ, a relationship between an amount of Co (content in CoFe; atomic %) in the Co—Fe—B alloy, and the index Δ ($KV/k_BT$) of the thermal stability were shown in FIG. 6.

As can be seen from FIG. 6, when the element size was 50 nmφ, Co—Fe—B alloy composition dependency of the thermal stability index Δ was largely varied from the Co—Fe—B alloy composition dependency of Δ obtained in the elliptical memory element having a short axis of 0.09 μm×a long axis of 0.18 μm shown in FIG. 4.

According to FIG. 6, the high thermal stability was maintained only in the case of Co—Fe—B alloy composition where Fe is 60 atomic % or more.

As a result of various reviews, it was clear that the reason why the Co—Fe—B alloy containing Fe of 60 atomic % or more shows the high thermal stability Δ in the extremely minute memory element was revealed to be because the magnetization of the Co—Fe—B alloy faced a direction perpendicular to a film face.

The reason why the magnetization of the Co—Fe—B alloy faces the direction perpendicular to the film face is considered to be because of a composition in which the magnitude of $M_{effective}$, the effective diamagnetic field, is significantly smaller than the saturated magnetization amount Ms.

In addition, the reason why the thermal stability is secured even in the case of the extremely minute element of a perpendicular magnetization film is related to $H_k$ (effective anisotropy field) in the equation (2), and $H_k$ of the perpendicular magnetization film becomes a value significantly larger than that in the in-plane magnetization film. That is, in the perpendicular magnetization film, due to an effect of large $H_k$, it is possible to maintain a high thermal stability Δ even in the case of the extremely minute element not capable of securing a sufficient thermal stability Δ in the in-plane magnetization film.

From the above-described experiment results, in regard to the Co—Fe—B alloy having a composition of $(Co_xFe_{100-x})_{80}B_{20}$, in a case where the amount of $Fe_{100-x}$ is 60 or more, this alloy may be said to be suitable for the memory device of Gbit class using the spin injection.

Experiment 4

As can be seen from the above-described experiment 3, in a case the amount of F was 60 or more in the Co—Fe—B alloy having a composition of $(Co_xFe_{100-x})_{80}B_{20}$, this alloy was suitable for the memory device of the Gbit class using the spin injection. In experiment 4, a memory element having the size of 50 nmφ was manufactured using the Co—Fe—B alloy containing B in an amount of 5 to 30 atomic %, and the thermal stability was evaluated.

The details other than the element size were substantially the same as those in the experiment 1.

A relationship between the index Δ ($KV/k_BT$) of the thermal stability and the Co—Fe—B alloy having a composition $(Co_xFe_{100-x})_{100-z}B_z$ in which an amount x of Co was 50, 40, 30, 20, 10, and 0, and an amount z of B was 5, 10, 20, and 30 was shown in Table 4.

TABLE 4

|  | $(Co_{50}—Fe_{50})_{100-z}—B_z$ | $(Co_{40}—Fe_{60})_{100-z}—B_z$ | $(Co_{30}—Fe_{70})_{100-z}—B_z$ |
|---|---|---|---|
| $B_z$ = 25 atomic % | 19 | 40 | 42 |
| $B_z$ = 10 atomic % | 20 | 41.5 | 43 |

TABLE 4-continued

| | | | |
|---|---|---|---|
| $B_Z$ = 20 atomic % | 20 | 43 | 44 |
| $B_Z$ = 30 atomic % | 21 | 45 | 47 |

| | $(Co_{20}\text{—}Fe_{80})_{100-z}\text{—}B_z$ | $(Co_{10}\text{—}Fe_{90})_{100-z}\text{—}B_z$ | $Fe_{100-z}\text{—}B_z$ |
|---|---|---|---|
| $B_Z$ = 25 atomic % | 42 | 43 | 44 |
| $B_Z$ = 10 atomic % | 44 | 44 | 45 |
| $B_Z$ = 20 atomic % | 45 | 46 | 46 |
| $B_Z$ = 30 atomic % | 48 | 48 | 48 |

As can be seen from Table 4, the thermal stability Δ in all compositions except that a case where the amount x of Co was 50, and the amount z of B was 5 to 30 was maintained to be large.

That is, as is the case with the result of the experiment 4, it was revealed that the amount x of Co of 50 and 60 became a boundary line for securing high thermal stability in a extremely minute element corresponding to the spin injection type magnetization inversion memory of the Gbit class.

Therefore, from the above-described result, it was revealed that the Co—Fe—B alloy of the memory layer 17 was suitable for manufacturing the spin injection type magnetization inversion memory of Gbit class in the following composition:

$(Co_x\text{—}Fe_y)_{100-z}\text{—}B_z$,

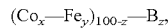

Here, $0 \leq Co_x \leq 40$,
$60 \leq Fe_y \leq 100$,
$0 < B_z \leq 30$.

In addition, in regard to the Co—Fe—B alloy, in a composition where the ratio of Fe was greater in Co and Fe, the difference between the magnitude $M_{effective}$ of the effective diamagnetic field and the saturated magnetization amount Ms becomes large, and this alloy is apt to be magnetized, and therefore it is easy to secure thermal stability.

Therefore, in a case where the capacity of the magnetic memory increases and the size of the memory element 3 decreases, it is easy to secure the thermal stability in the Co—Fe—B alloy containing a large amount of Fe.

Therefore, for example, when a situation is assumed where the spin injection type magnetic memory of the Gbit class is realized by the memory layer 17 in which the amount y of Fe is 60, and the size thereof is 70 nmϕ, it is preferable that whenever the diameter of the memory element 3 decreases by 5 nmϕ, the amount y of Fe in the Co—Fe—B alloy increase by a value of 5.

For example, in the case of the $(Co_x\text{—}Fe_y)_{100-z}$—B, the amount y of Fe is set in a manner that an atomic % as a content in CoFe is 65%, 70%, 75%, 80%, . . . (in terms of the amount x of Co, 35%, 30%, 25%, 20%, . . . ), and this is a more appropriate example to correspond to the size reduction of the memory element.

4. Configuration of Second Example

Hereinafter, a second embodiment will be described. In addition, a configuration example of a memory device and a memory element of the second embodiment are substantially the same as those shown in FIGS. 1 and 2, and therefore redundant description thereof will not be repeated.

The second embodiment use Co—Fe—B as the memory layer 17 and the magnetization-fixed layer 15 similarly to the first embodiment, but the composition of the Co—Fe—B is set to $(Co_x\text{—}Fe_y)_{100-z}\text{—}B_z$, in which $0 \leq Co_x \leq 40$, $60 \leq Fe_y \leq 100$, and $20 < B_z \leq 40$.

When assuming the manufacturing of a spin injection type magnetization inversion memory that is a semiconductor device, it is preferable that a magnetic material making up the memory element 3 show an excellent characteristic within a temperature range permissible in a semiconductor process.

For example, since a thermal load, which is applied in the semiconductor processes performed up to when a chip is manufactured from an Si substrate through all the processes, may be 350° C. or more, when considering this condition, it is necessary for a magnetic material making up the memory element 3 to have an excellent characteristic even when it is subjected to a heat treatment at temperatures of 350° C. or more.

In addition, on the other hand, when a transistor necessary for the operation of the memory device is generally exposed to high temperatures of, for example, 450° C. or more, a characteristic thereof is apt to be deteriorated. Therefore, a magnetic material showing an excellent characteristic at a state of being heated at high temperatures of 450° C. or 500° C. is also not suitable.

Therefore, when assuming the manufacturing of a spin injection type magnetization inversion memory, it is necessary that the magnetic material making up the memory element 3 shows an excellent characteristic at a temperature equal to or more than 350° C. and less than 450° C.

From the viewpoint of thermal compatibility with the semiconductor processes, since a magnetic characteristic or a TMR characteristic of a general perpendicular magnetization material is deteriorated at high temperatures of 250° C. or more, or a magnetic characteristic is shown at high temperatures of 500° C. or more, it is difficult to handle the perpendicular magnetization film.

However, as described above, the perpendicular magnetization film is suitable for the large capacity and low power consumption. Therefore, it is important to develop the perpendicular magnetization film for a spin injection type magnetization inversion memory, which shows low inversion current and high output characteristics at a heat treatment condition highly compatible with the semiconductor processes.

Therefore, the second embodiment is based on a recognition in that in regard to the memory device using the memory element 3 having a perpendicular magnetic anisotropy suitable for low power consumption as described above, it is necessary to secure a large magnetoresistance change ratio within a heat treatment temperature equal to or more than 350° C. and less than 450° C.

To diminish a write current as described above, it is preferable to adopt the perpendicular type. In addition, generally, it is possible to make a perpendicular magnetic film have a high magnetic anisotropy compared to an in-plane magnetization film, such that this configuration is preferable in the viewpoint of maintaining the above-described thermal stability Δ to be high.

As the magnetic material having the perpendicular anisotropy, a rare-earth transition metal alloy (TbCoFe or the like), a metal multi-layered film (Co/Pd multi-layered film or the like), an ordered alloy (FePt or the like), a magnetic material using an interface anisotropy between an oxide and a magnetic metal (Co/MgO or the like), or the like may be exemplified. However, when being diffused and crystallized by heating, the rare-earth transition metal alloy loses the perpendicular magnetic anisotropy, such that it is not preferable for the spin injection type magnetization inversion memory. In addition, it is disclosed that when metal multi-layered film is diffused by heating, the anisotropy thereof is deteriorated, and the perpendicular magnetic anisotropy is revealed at the time of (111) face-centered cubic orientation, such that it becomes difficult to realize the (001) orientation necessary for MgO or a high polarizability layer such as Fe, CoFe, and CoFeB that is disposed adjacent to MgO.

L10 ordered alloy is stable at a high temperature, and reveals the perpendicular magnetic anisotropy at the time of (001) orientation, such that the above-described problem does not occur at this ordered alloy, but it is necessary to heat the ordered alloy at sufficient high temperatures of 500° C. or more at the time of manufacturing process, or it is necessary to perform a heat treatment at high temperatures of 500° C. or more after the manufacturing process for ordering atoms, and therefore this ordered alloy has a low compatibility with the semiconductor processes. In addition, this ordered alloy may cause a diffusion which is not preferred at another portion of a laminated film such as a tunnel barrier, or may increase interface roughness.

Contrary to this, in the case of a material using an interface magnetic anisotropy, that is, a material having a configuration in which a Co-based or Fe-based material is laminated on MgO, the above-described problem occurs with difficulty, and therefore this material shows promise as a material for a memory layer of a spin injection type magnetization inversion memory.

Therefore, the present inventors made a thorough investigation, and as a result thereof, they found that in the case of a magnetic material that is formed of Co—Fe—B and has a composition of $(Co_x—Fe_y)_{100-z}—B_z$, in which $0 \leq Co_x \leq 40$, $60 \leq Fe_y \leq 100$, and $20 < B_z \leq 40$, this material can highly maintain the spin polarizability P in the equation expressing the inversion current even in a state where the heat treatment temperature is 350° C. or more.

In regard to a high output element, when the spin polarizability P is high, a low inversion current may be realized according to this embodiment.

Furthermore, when a perpendicular magnetization material having a high magnetic anisotropy is used, it is possible to provide a spin injection type magnetization inversion element (memory element 3) of a high output and low power consumption.

A configuration of the memory device and the memory element 3 according to the second embodiment is substantially the same as that shown in FIGS. 1 and 2, but the memory layer 17 of the memory element 3 has the above-described composition.

Specifically, according to the memory element of the second embodiment, the memory layer 17 that retains information by a magnetization state of a magnetic material is provided, and a magnetization-fixed layer 15 is provided with respect to the memory layer 17 through an insulating layer 16 that is an intermediate layer. An electron that is spin-polarized is injected in a lamination direction and thereby a magnetization direction varies and a recording of information is performed with respect to the memory layer 17 magnetized in a direction perpendicular to a film face. Here, as a ferromagnetic material making up the memory layer 17, for example, the Co—Fe—B having the above-described composition is used, such that a high tunnel magnetoresistive effect and a low inversion current characteristic may be obtained even under a high temperature heat treatment.

In this manner, the high output under the high temperature heat treatment may be realized and the magnetization inversion with a low current may occur.

In addition, in regard to the memory device using this memory element 3, a current flows into the memory element 3 in the lamination direction thereof through two kind of interconnects (interconnects 1 and 6 in FIG. 1), and thereby a spin transfer occur, such that it is possible to perform the recording of information through a spin torque magnetization inversion by flowing a current in the lamination direction of the memory element 3 through the two kind of interconnects.

According to the second embodiment, it is possible to obtain characteristics of a high output and a low current operation even under the high temperature heat treatment, such that it is possible to configure the memory element 3 excellent in balance characteristics.

In addition, the perpendicular magnetization film having a high magnetic anisotropy is used, such that the thermal stability of information does not deteriorate.

In this manner, an operation error is removed and an operation margin of the memory element 3 is sufficiently obtained, such that it is possible to stably operate the memory element 3.

The above-described material shows an excellent characteristic at a high temperature heat treatment at a temperature equal to or more than 350° C. and less than 450° C., such that this material has a high compatibility with semiconductor processes.

In addition, the write current with respect to the memory element 3 is diminished, such that it is possible to diminish power consumption of the memory element 3.

Therefore, it is possible to diminish the power consumption of the entirety of the memory device in which a memory cell is configured by the memory element 3 of this embodiment.

Therefore, it is possible to realize a memory that operates stably with high reliability.

In addition, the memory that includes the memory element 3 shown in FIG. 2 and has the configuration shown in FIG. 1 has an advantage in that a general semiconductor MOS forming process may be applied when the memory is manufactured.

Therefore, it is possible to apply the memory of this embodiment as a general purpose memory.

In addition, the magnetization-fixed layer 15 may be formed of the Co—Fe—B having the above-described configuration.

In addition, in the second embodiment, when the insulating layer 16 that is an intermediate layer is formed of a magnesium oxide, it is possible to make the magnetoresistance change ratio (MR ratio) large.

When the MR ratio becomes high, the spin injection efficiency is improved, and therefore it is possible to further decrease the current necessary for inverting the direction of the magnetization M17 of the memory layer 17.

In addition, the memory element 3 may be manufactured by continuously forming from the underlying layer 14 to the cap layer 18 in a vacuum apparatus, and then by forming a pattern of the memory element 3 by a processing such as a subsequent etching or the like.

5. Experiment Related to Second Embodiment

In regard to the configuration of the memory element 3 of this embodiment, the material of the ferromagnetic layer making up the memory layer 17 was specifically selected, and then a characteristic of the memory element 3 was investigated.

As was the case with the above-described experiment 1 to 4, an investigation was made into a wafer on which only the memory element 3 was formed for the purpose of investigating the magnetization inversion characteristic of the memory layer 17.

Experiment 5

Figure 7:
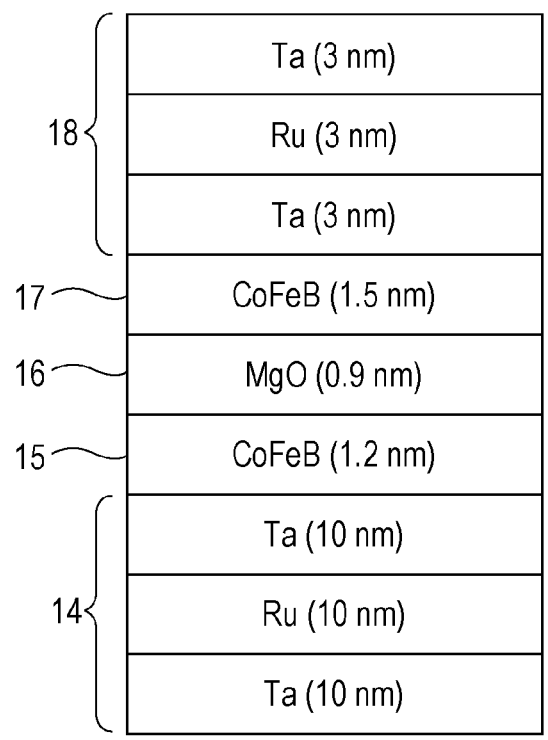
FIG. 7 is an explanatory view illustrating a layer structure of a sample of a memory element used for an experiment.

A thermal oxide film having the thickness of 300 nm was formed on a silicon substrate having the thickness of 0.725 mm, and the memory element 3 having a configuration shown in FIG. 2 was formed on the thermal oxide film as shown in FIG. 7.

Underlying layer 14: Laminated film of a Ta film having a film thickness of 10 nm and a Ru film having a film thickness of 10 nm Magnetization-fixed layer 15: CoFeB film having a film thickness of 1.2 nm Tunnel insulating layer 16: Magnesium oxide film having a film thickness of 0.9 nm Memory layer 17: CoFeB film having the same composition as that of the magnetization-fixed layer Cap layer 18: Laminated film of a Ta film having a film thickness of 3 nm, a Ru film having the thickness of 3 nm, and a Ta film having the thickness of 3 nm Each layer was selected as described above, a Cu film (not shown) having a film thickness of 100 nm (serving as a word line described below) was provided between the underlying layer 14 and the silicon substrate.

In the above-described configuration, the ferromagnetic layer of the memory layer 17 was formed of a ternary alloy of Co—Fe—B, and a film thickness of the ferromagnetic layer was fixed to 1.5 nm.

Each layer other than the insulating layer 16 formed of a magnesium oxide film was formed using a DC magnetron sputtering method.

The insulating layer 16 formed of the magnesium oxide (MgO) film was formed using an RF magnetron sputtering method.

In addition, after forming each layer of the memory element 3, a heating treatment was performed in a magnetic field heat treatment furnace at various temperatures for one hour.

Next, after masking a word line portion by photolithography, a selective etching by Ar plasma was performed with respect to a laminated film other than the word line portion, and thereby the word line (lower electrode) was formed. At this time, a portion other than the word line was etched to the depth of 5 nm in the substrate.

Then, a mask of a pattern of the memory element 3 by an electron beam drawing apparatus was formed, a selective etching was performed with respect to the laminated film, and thereby the memory element 3 was formed. A portion other than the memory element 3 was etched to a portion of the word line immediately over the Cu layer.

In addition, in the memory device for the characteristic evaluation, it is necessary to make a sufficient current flow to the memory element so as to generate a spin torque necessary for the magnetization inversion, such that it is necessary to suppress the resistance value of the tunnel insulating layer. Therefore, a pattern of the memory element 3 was set to an elliptical shape having a short axis of 0.09 µm×a long axis of 0.18 µm, and an area resistance value ($\Omega\mu m^2$) of the memory element 3 was set to 20 $\Omega\mu m^2$.

Next, a portion other than the memory element 3 was insulated by sputtering $Al_2O_3$ to have a thickness of substantially 100 nm.

Then, a bit line serving as an upper electrode and a measurement pad were formed by using photolithography.

In this manner, a sample of the memory element 3 was manufactured.

By the above-described manufacturing method, each sample of the memory element 3 in which a composition of Co—Fe—B alloy of the ferromagnetic layer of the memory layer 17 was changed was manufactured.

In the composition of the Co—Fe—B alloy, a composition ratio (atomic %) of Co and Fe was fixed to 20:80, and a composition ratio z (atomic %) of B was changed to 10%, 20%, 30%, 35%, 40%, and 50%.

With respect to each sample of the memory element 3 manufactured as described above, a characteristic evaluation was performed as described below.

TMR Measurement

A TMR measurement was performed for the purpose of evaluating an output characteristic of the memory element according to the embodiment.

A voltage of 100 mV was applied to the memory element 3 while applying a magnetic field thereto within a range of 3 kOe, and then resistance value of the memory element 3 was measured.

In addition, twenty memory elements 3 with the same configuration were manufactured to take variation in the memory elements 3 into consideration, the above-described measurement was performed, and an average value of a characteristic was obtained.

Figure 8:
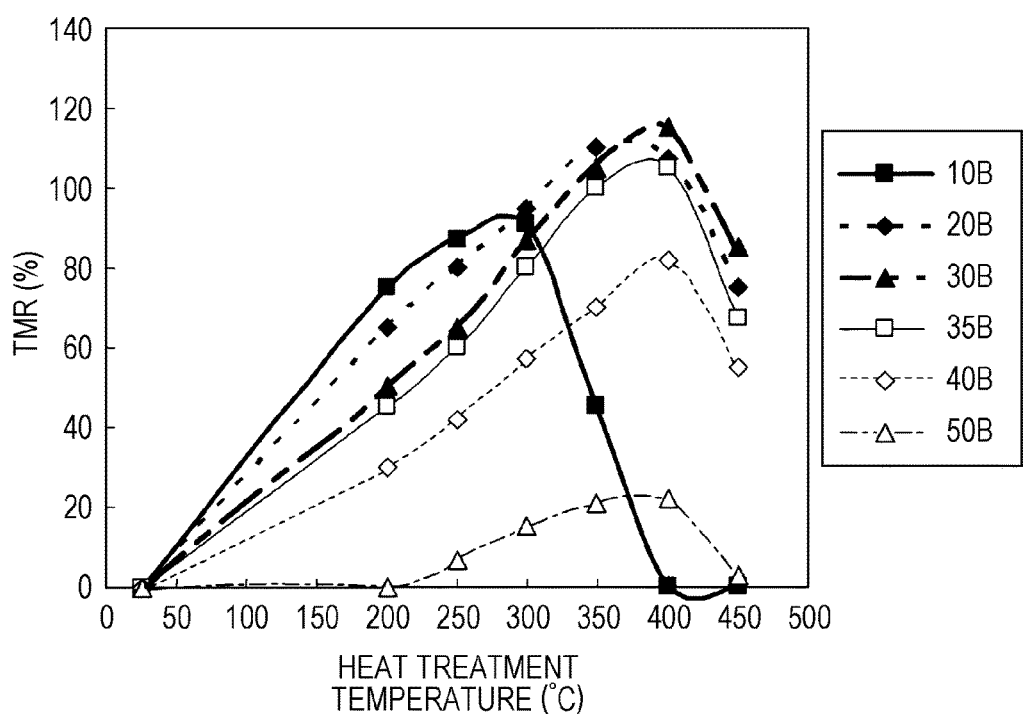
FIG. 8 is a diagram illustrating a heat treatment temperature dependency of TMR for each composition of Co—Fe—B of the memory layer of the embodiment.

FIG. 8 shows a heat treatment temperature dependency of a TMR for each composition of Co—Fe—B alloy of the memory layer 17, with respect to each sample of the memory element 3.

As can be seen from FIG. 8, in a case where a concentration of B is 10% (10B in the drawing), a TMR shows a peak in the vicinity of the heat treatment temperature near 300° C.

Contrary to this, in the case of a composition range in which the concentration of B is 20 to 40% (20B to 40B in the drawing), the peak of the TMR shifts to the heat treatment temperature near 300 to 400° C.

In addition, in a case where the concentration of B is 50% (50B in the drawing), when the heat treatment of 200° C. or more is performed, the TMR is observed, but it can be seen that the absolute value of the TMR becomes extremely small compared to a Co—Fe—B alloy of other composition.

In a case where the concentration of B is 40%, the TMR is slightly small compared to the maximum TMR (substantially 110%) of a sample having the concentration of B of 10 to 35%, but 80% of the TMR is secured near the temperatures of 350 to 400° C. and therefore reaches an output applicable to the spin injection type magnetization inversion memory.

In addition, in the case of a sample having the concentration of B of 20 to 30%, the TMR is sufficiently secured near 450° C.

In conclusion, in the case of a composition range in which the concentration of B is 20 to 40%, it can be confirmed that the most excellent TMR characteristic is obtained at a heat treatment range that is the most compatible with the semiconductor processes.

Generally, in the case of forming a tunnel magnetic junction using the Co—Fe—B alloy, B diffuses to the MgO barrier (insulating layer 16) or cap layer 18 side by the heat treatment. The reason why at the heat treatment temperatures of 350 to 400° C., 20 to 40% of the concentration of B is appropriate is related to the diffusion of B, and is expected to be because when a predetermined amount of B is contained in the alloy film as an initial Co—Fe—B alloy composition, a distribution of B capable of obtaining excellent perpendicular magnetic characteristic and TMR characteristic at a desired heat treatment temperature range is realized, and according to this, an interface magnetic anisotropy of the MgO barrier and the Co—Fe—B alloy is enhanced.

According to this expectation, a concentration of B capable of obtaining an excellent TMR characteristic even under a high temperature treatment of 450° C. or more is present, but in the case of a sample used for this experiment, since roughness in the underlying layer 14 increases at a heat treatment exceeding a temperature of 450° C. and excessive diffusion occurs in the underlying layer 14 and the cap layer 18, the TMR characteristic of the Co—Fe—B in all concentrations of B is considered to be deteriorated.

In a case where the concentration of B is 10%, the cause of the deterioration in the TMR characteristic at a high temperature of 350° C. or more is considered to be because, when performing the high temperature heat treatment, it is difficult to enhance the interface magnetic anisotropy of the MgO barrier and the Co—Fe—B alloy due to too small concentration of B.

In addition, the cause of not being able to obtain an excellent TMR characteristic when the concentration of B is 50%, it is assumed to be because the the concentration of B is too high and therefore the saturated magnetization is extremely decreased.

From the above-described results, in the case of the Co—Fe—B alloy in which a composition ratio (atomic %) of Co and Fe is fixed to 20:80, it is verified that when the concentration of B is 20 to 40%, it is possible to manufacture the memory element 3 having a high output at a heat treatment temperature range of 350 to 450° C.

Experiment 6

In the above-described experiment 5, there was shown a detailed experiment result at the time of changing the concentration of B with a specific Co/Fe ratio. Next, in an experiment 6, a memory element 3 in which the concentration of B was changed to 20%, 30%, and 40%, respectively, with the Co/Fe ratio of 40/60, 30/70, and 10/90 was manufactured, and an evaluation on the TMR characteristic was performed.

Figure 9A:
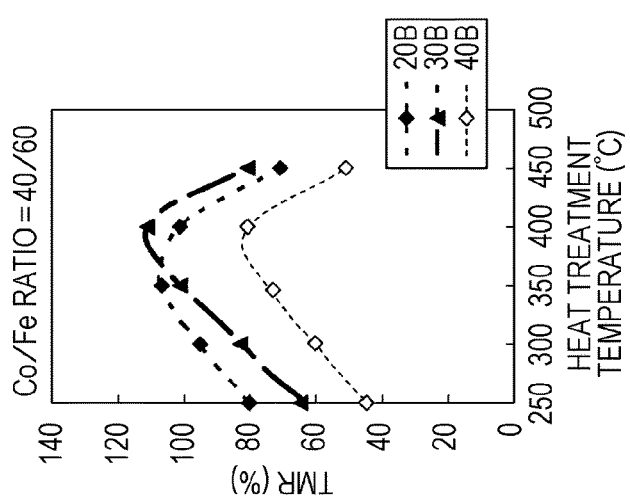
FIGS. 9A to 9C are diagrams illustrating a result of measuring the a TMR characteristic in a case where in regard to the Co—Fe—B of the memory layer of the embodiment, a concentration of B and a heat treatment temperature are changed at a ratio of Co/Fe.
Figure 9B:
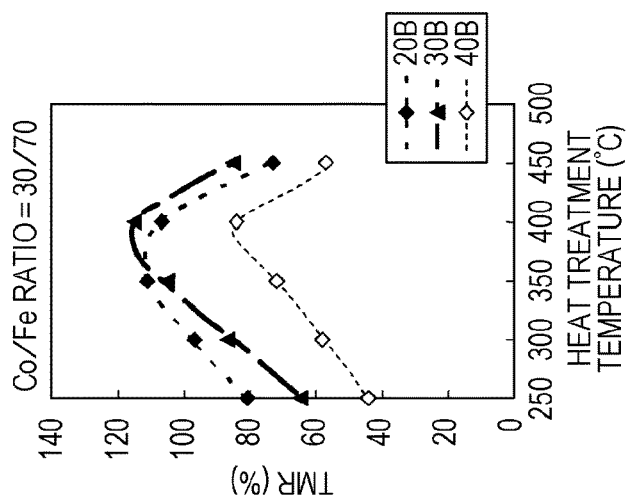
Figure 9C:
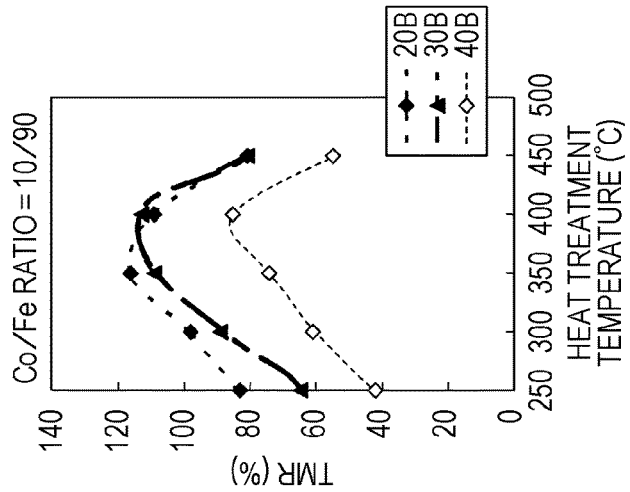

FIGS. 9A to 9C show the TMR characteristic in the case of changing the concentration of B and the heat treatment temperature with each Co/Fe ratio.

As can be seen from the results, it is possible to obtain the high output (high TMR) at the concentration of B [20% to 40%] shown in the experiment 5, and the heat treatment temperature [350° C. to 400° C.], in all compositions.

In addition, in a certain composition, the high output (high TMR) is realized even at near 450° C. For example, this composition corresponds to a composition in which the concentration of B is 20 to 30%.

In addition, a large Co/Fe ratio dependency of the TMR value is not observed.

From the results of above-described experiments 5 and 6, it can be seen that when a perpendicular magnetization ferromagnetic material Co—Fe—B having a composition of $(Co_x—Fe_y)_{100-z}—B_z$ in which $0 \leq Co_x \leq 40$, $60 \leq Fe_y \leq 100$, and $20 < B_z \leq 40$ is used, it is possible to provide a memory element having a high output at heat treatment temperatures of 350° C. to 400° C. that are highly compatible with semiconductor processes.

In addition, when the high output is realized, high spin polarizability P is also realized, and therefore low power consumption is also possible.

As described above, when using the magnetic anisotropy in which the perpendicular magnetization is high, it is possible to provide a spin injection magnetization inversion element of high output and low inversion current, without using a method in which the thermal stability is sacrificed.

In addition, in the first embodiment, in regard to the concentration of B, it is described that the magnitude $M_{effective}$ of the effective diamagnetic field becomes smaller than the saturated magnetization amount Ms in a range of $0 < B_z \leq 30$, such that this concentration is suitable for the perpendicular magnetization (for example, refer Table 2). Contrary to this, in the second embodiment, the concentration of B is set to $20 < B_z \leq 40$, and a range of 30% to 40% seems to be unsuitable.

However, in a case where the heat treatment is performed at a relatively high temperature, even when the concentration of B is within a range of 30% to 40%, it is found that the magnitude $M_{effective}$ of the effective diamagnetic field becomes less than the saturated magnetization amount Ms, and therefore this range is also suitable for the perpendicular magnetization.

The following Table 5 shows the result of an investigation made on a relationship between the saturated magnetization amount Ms and the magnitude $M_{effective}$ of the effective diamagnetic field in a case where the heat treatment temperature is set to 400° C. with respect to the composition of Co—Fe—B of the memory layer 17, that is, $(Co_{70}—Fe_{30})_{65}—B_{35}$, and $(Co_{70}—Fe_{30})_{60}—B_{40}$.

TABLE 5

|  | Ms (emu/cc) | Meffective (emu/cc) | Meffective/Ms |
|---|---|---|---|
| $(Co_{70}Fe_{30})_{65}—B_{35}$ | 740 | 650 | 0.88 |
| $(Co_{70}Fe_{30})_{60}—B_{40}$ | 720 | 550 | 0.89 |

Even in a case where the concentration of B is either 35% or 45%, the magnitude $M_{effective}$ of the effective diamagnetic field is less than the saturated magnetization amount Ms ($M_{effective}/Ms<1$).

That is, in a case where the heat treatment temperature is high, the concentration range of B of 30% to 40% satisfies a condition where the magnitude of the actual diamagnetic field which the memory layer 17 receives is less than the saturated magnetization amount of the memory layer 17.

6. Modification

Hereinbefore, the embodiments are described, but the present disclosure is not limited to the film configuration of the memory element 3 illustrated in the above-described embodiment, and it is possible to adopt various film configurations.

For example, in the embodiments, the Co—Fe—B composition of the memory layer 17 and the magnetization-fixed layer 15 was made to be the same as each other, but it is not limited to the above-described embodiment, and various configurations may be made without departing from the scope.

In addition, in the embodiments, only a single underlying layer 14, a cap material, and a shape of the memory element are shown, but it is not limited thereto, and various configuration may be made without departing from the scope.

In the embodiments, the magnetization-fixed layer 15 was formed of a single layer, but the magnetization fixed layer 15 may use a laminated ferri-pin structure including two ferromagnetic layers and a non-magnetic layer. In addition, a structure in which anti-ferromagnetic film is applied to the laminated ferri-pin structure film is possible.

In addition, a film configuration of the memory element may be a configuration in which the memory layer 17 is disposed at an upper side of the magnetization-fixed layer 15 or a configuration in which the memory layer 17 is disposed at a lower side. In addition, this film configuration may be so-called dual structure in which the magnetization-fixed layer 15 is disposed at the upper side and the lower side of the memory layer 17.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A storage element comprising:
   a first layer having a magnetization state of a first magnetic material;
   a second layer having a fixed magnetization state of a second magnetic material;
   an intermediate layer including a nonmagnetic material and being interposed between the first layer and the second layer;
   wherein the first layer is configured to store information according to the magnetization state of the first magnetic material,
   wherein a magnitude of an effective diamagnetic field which the first layer receives is smaller than a saturated magnetization amount of the first layer,
   wherein the first magnetic material includes Co, Fe, and B, where the amount of B ranges from greater than 20 at % to 40 at %, and where the amount of Fe ranges from 36 at % to less than 80 at %, and
   wherein a ratio of Co and Fe in the first magnetic material which includes the Co, Fe and B is 7 to 3.

2. The storage element according to claim 1, wherein the first magnetic material includes a ferromagnetic material.

3. The storage element according to claim 1, wherein the magnetization state of the first magnetic material is configured to be changed by a current.

4. The storage element according to claim 1, wherein the second magnetic material includes Co, Fe, and B.

5. The storage element according to claim 1, wherein the intermediate layer includes at least one of magnesium oxide, aluminum oxide, aluminum nitride, $SiO_2$, $Bi_2O_3$, $MgF_2$, CaF, $SrTiO_2$, $AlLaO_3$, and AlNO.

6. The storage element according to claim 1, further comprising a cap layer.

7. The storage element according to claim 6, wherein the cap layer includes Ru or Ta.

8. The storage element according to claim 7, wherein the cap layer includes a laminated film including a first Ta film, a second Ta film, and a Ru film formed between the first and second Ta films.

9. The storage element according to claim 1, further comprising an underlying layer.

10. The storage element according to claim 9, wherein the underlying layer includes Ru or Ta.

11. The storage device according to claim 10, wherein the underlying layer includes a laminated film of a Ta film and a Ru film.

12. The storage device according to claim 1, wherein a film thickness of the second layer is greater than a film thickness of the first layer.

13. The storage device according to claim 1, wherein a damping constant of the second layer is greater than a damping constant of the first layer.

14. The storage device according to claim 1, wherein the second layer has a laminated ferri-pin structure including two ferromagnetic layers and a non-magnetic layer.

15. The storage device according to claim 14, further comprising an anti-ferromagnetic layer applied to the laminated ferri-pin structure.

16. The storage device according to claim 1, wherein a magnetization direction of the first magnetic material is perpendicular to a substrate of the storage device.

17. A memory device, comprising:
   an storage element that retains information through a magnetization state of a magnetic material; and
   two kinds of interconnects that intersect each other,
   wherein the storage element includes
   a first layer having a magnetization state of a first magnetic material;
   a second layer having a fixed magnetization state of a second magnetic material;
   an intermediate layer including a nonmagnetic material and being interposed between the first layer and the second layer;
   wherein the first layer is configured to store information according to the magnetization state of the first magnetic material,
   wherein a magnitude of an effective diamagnetic field which the first layer receives is smaller than a saturated magnetization amount of the first layer,
   wherein the first magnetic material includes Co, Fe, and B, where the amount of B ranges from greater than 20 at % to 40 at %, and where the amount of Fe ranges from 36 at % to less than 80 at %, and
   wherein a ratio of Co and Fe in the first magnetic material which includes the Co, Fe and B is 7 to 3.

18. The storage device according to claim 1, wherein the amount of B ranges from greater than 30 at % to 40 at %.

19. The memory device according to claim 17, wherein the amount of B ranges from greater than 30 at % to 40 at %.

* * * * *